United States Patent [19]
Chino et al.

[11] Patent Number: 5,796,714
[45] Date of Patent: Aug. 18, 1998

[54] OPTICAL MODULE HAVING A VERTICAL-CAVITY SURFACE-EMITTING LASER

[75] Inventors: Toyoji Chino, Toyonaka; Kenichi Matsuda, Moriguchi; Takayuki Yoshida, Neyagawa; Kenzo Hatada, Katano, all of Japan

[73] Assignee: Matsushita Electric Industrial Co., Ltd., Kadoma, Japan

[21] Appl. No.: 533,364

[22] Filed: Sep. 25, 1995

[30] Foreign Application Priority Data

Sep. 28, 1994 [JP] Japan .................... 6-233834

[51] Int. Cl.$^6$ ........................................ H01S 3/19
[52] U.S. Cl. .................... 372/50; 372/96; 257/84
[58] Field of Search .............. 372/50, 96; 257/83, 257/84, 85, 778; 361/762; 438/108

[56] References Cited

U.S. PATENT DOCUMENTS

| | | | |
|---|---|---|---|
| 4,176,367 | 11/1979 | Uematsu | 257/85 |
| 5,132,982 | 7/1992 | Chan et al. | 372/50 |
| 5,311,404 | 5/1994 | Trask et al. | 361/762 |
| 5,357,122 | 10/1994 | Okubora et al. | 257/84 |
| 5,361,273 | 11/1994 | Kosaka | 257/84 |
| 5,408,105 | 4/1995 | Adachi et al. | 372/50 |
| 5,434,434 | 7/1995 | Kasahara et al. | 257/84 |

FOREIGN PATENT DOCUMENTS

| | | | |
|---|---|---|---|
| 63-192279 | 8/1988 | Japan | 257/83 |
| 287584 | 3/1990 | Japan . | |
| 534743 | 12/1993 | Japan . | |
| 9314520 | 7/1993 | WIPO . | |

OTHER PUBLICATIONS

Ogura et al, "A Multiple Wavelength Vertical Cavity Surface Emitting Laser (VCSEL) Array for Optical Interconnection", IEICE Trans. Electron., vol. E78–C, No. 1, Jan. 1995.

Search Report for European Appl. 95115103.4, mailed Jan. 23, 1996.

Maeda et al, IEEE Photonics Tech. Ltrs., Oct. 1991, No. 10, N.Y., pp. 863–865, "Multigigobit/s Operation of 16–Wavelength Vertical . . .".

Moseley et al, Electronics Ltrs., Jan. 1992, No. 1, GB, "Uniform 8×8 Array InGaAs/FnP Multiquantum Well Asymmetric Folery . . .".

Kajita et al, Extended Abs. of the '93 Intl. Conf. on Solid State Devices and Materials, pp. 694–696, 1993, "Thermal Analysis of Laser–Emission Surface–Normal Optical Devices with a Vertical Cavity." (No month available).

Kajita et al, Tech. Rept of IEICE, OOE93–105, pp. 49–54, "Thermal Analysis of Laser–Emission Surface–Normal Optical Devices with a Vertical Cavity." No month available).

*Primary Examiner*—Rodney B. Bovernick
*Assistant Examiner*—Yisun Song
*Attorney, Agent, or Firm*—Renner, Otto, Boisselle & Sklar

[57] ABSTRACT

The optical module of the invention includes: a first substrate; a vertical-cavity surface-emitting laser including an upper surface, a bottom surface and a semiconductor multilayered structure including at least a light-emitting layer, the vertical-cavity surface-emitting laser being supported on the first substrate; an electrode structure electrically connected with the bottom surface of the vertical-cavity surface-emitting laser, the electrode structure being supported on the first substrate; and a second substrate including a first bump and a second bump. In the optical module, an upper surface of the electrode structure and the upper surface of the vertical-cavity surface-emitting laser jut out from the first substrate. The second substrate is positioned with respect to the first substrate so that the first bump and the second bump come into contact with an upper surface of the electrode structure and the upper surface of the vertical-cavity surface-emitting laser, respectively.

51 Claims, 20 Drawing Sheets

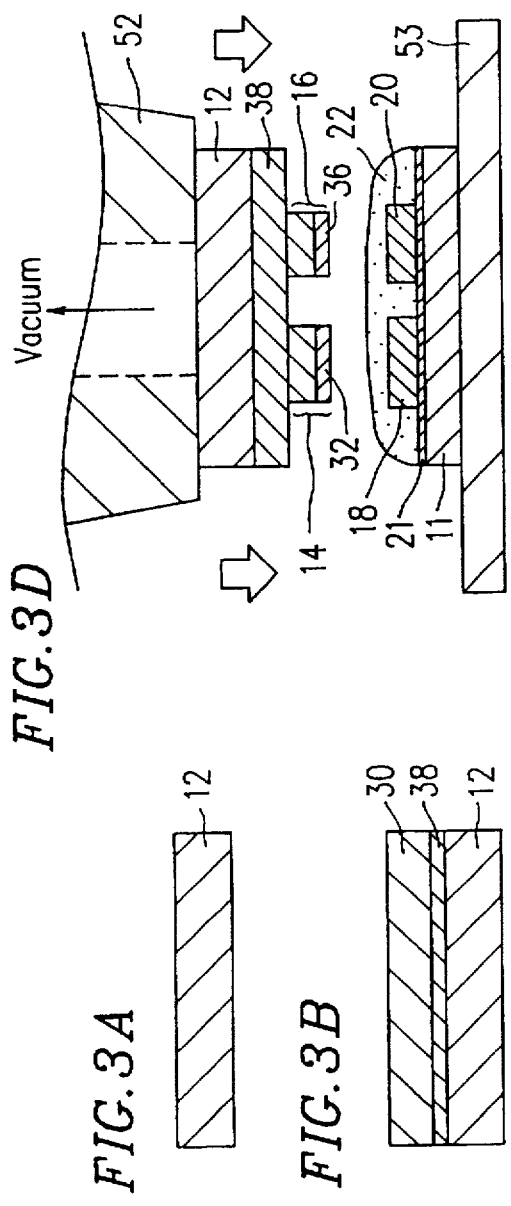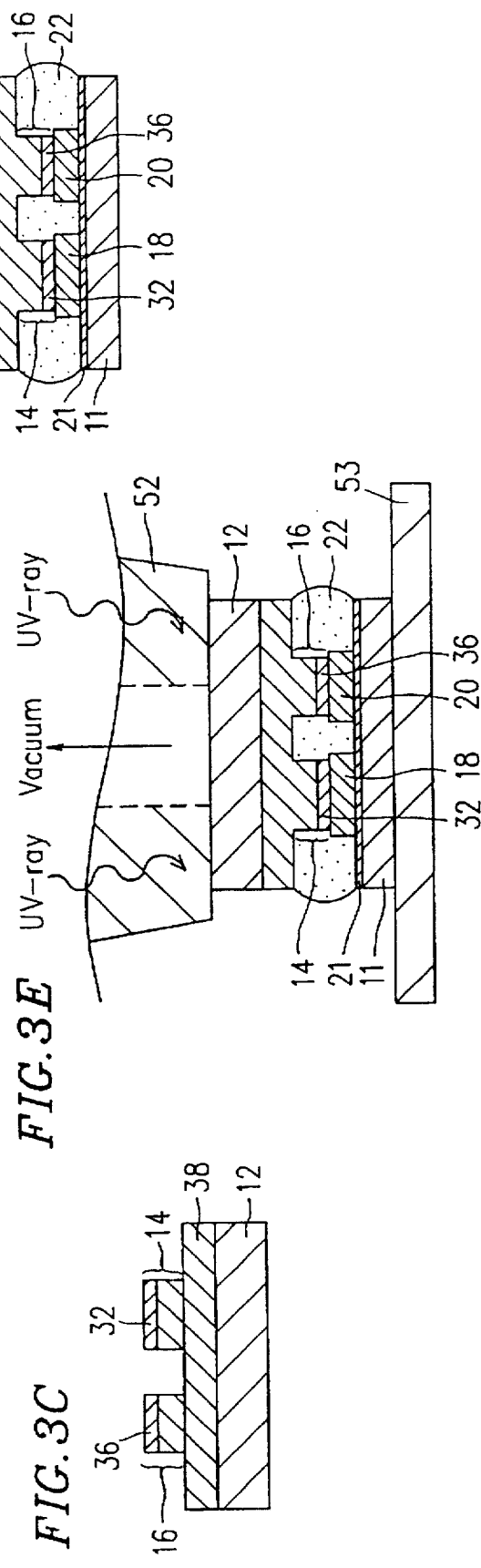

OPTICAL MODULE HAVING A VERTICAL-CAVITY SURFACE-EMITTING LASER

BACKGROUND OF THE INVENTION

1. Field of the Invention

The present invention relates to a semiconductor module, and more particularly, an optical module having a vertical-cavity surface-emitting laser and a submount.

2. Description of the Related Art

A vertical-cavity surface-emitting laser is expected to be a key device for realizing large-capacity optical communication by transmitting optical information in parallel through a plurality of laser devices arranged in an array. A mounting technology for such a vertical-cavity surface-emitting laser suitable for being interconnected with an optical fiber has been developed. A vertical-cavity surface-emitting laser including a submount is reported, for example, in 1993 *International Conference on Solid-State Devices and Materials*, pp. 694–696, or *Technical Report for Institute of Electronics, Information and Communication Engineers*, "Opto-quantum Electronics", OQE93–105.

As described in the above reports and shown in FIG. 21, a vertical-cavity surface-emitting laser 1002 obtained by interposing an emission thyrister having a p-n-p-n active layer between a pair of Bragg reflectors is formed on a GaAs substrate 1004, and a silicon nitride film 1006 is provided on the surface of the GaAs substrate 1004. An Au layer 1008 with a thickness of 9 μm is formed on the GaAs substrate 1004 by a plating method so as to cover the entire portion of the vertical-cavity surface-emitting laser 1002. The vertical-cavity surface-emitting laser 1002 plated with Au is flip-chip mounted on an AlN heat sink 1012 including an Sn/Pb solder bump 1010.

In this structure, most of the heat generated in the vertical-cavity surface-emitting laser 1002 is radiated from the AlN heat sink 1012 via the plated Au layer 1008 and the Sn/Pb solder bump 1010. Only a part of the heat is radiated directly from the Au into the air. The heat is further radiated directly from the active layer into the GaAs substrate 1004.

According to the conventional technique described above, the GaAs substrate 1004 is bonded with the AlN heat sink 1012 by plastically molding the metal therebetween. Therefore, a load large enough to cause plastic to mold is required to be applied between the GaAs substrate 1004 and the AlN heat sink 1012. A part of the load is necessarily applied to the active layer of the vertical-cavity surface-emitting laser 1002. However, the load applied to the active layer of the vertical-cavity surface-emitting laser 1002 considerably degrades the emission efficiency of the laser. In a worst case, light can not be emitted from the laser at all.

In addition, the solder bump 1010 made of Sn/Pb has a thermal conductivity one sixth as low as that of Au, so that the heat cannot be satisfactorily conducted in this portion. As a result, even if the AlN heat sink 1012 has a sufficiently high thermal conductivity, the heat cannot be satisfactorily radiated.

Furthermore, according to the conventional technique, the surface of the mesa of the vertical-cavity surface-emitting laser 1002 is required to be plated with Au. Therefore, an additional process must be performed.

SUMMARY OF THE INVENTION

The optical module of this invention, includes: first substrate; a vertical-cavity surface-emitting laser comprising an upper surface, a bottom surface and a semiconductor multi-layered structure including at least a light-emitting layer, the vertical-cavity surface-emitting laser being supported on the first substrate; an electrode structure electrically connected with the bottom surface of the vertical-cavity surface-emitting laser, the electrode structure being supported on the first substrate; and a second substrate comprising a first bump and a second bump. An upper surface of the electrode structure and the upper surface of the vertical-cavity surface-emitting laser jut out from the first substrate, and the second substrate is positioned with respect to the first substrate so that the first bump and the second bump come into contact with an upper surface of the electrode structure and the upper surface of the vertical-cavity surface-emitting laser, respectively.

In one embodiment of the invention, the optical module further includes a transistor supported on the first substrate and a third bump provided on the second substrate, wherein the third bump is partially in contact with the transistor.

According to another aspect of the invention, an optical module includes: a first substrate; a vertical-cavity surface-emitting laser comprising an upper surface, a bottom surface and a semiconductor multi-layered structure including at least a light-emitting layer, the vertical-cavity surface-emitting laser being supported on the first substrate; an electrode structure electrically connected with the bottom surface of the vertical-cavity surface-emitting laser, the electrode structure being supported on the first substrate; a first supporting structure comprising a conductive upper surface, the first supporting structure being supported on the first substrate; a first line for electrically connecting the upper surface of the vertical-cavity surface-emitting laser and the first supporting structure; and a second substrate comprising a first bump and a second bump. An upper surface of the electrode structure and the upper surface of the first supporting structure jut out from the first substrate, and the second substrate is positioned with respect to the first substrate so that the first bump and the second bump come into contact with an upper surface of the electrode structure and the upper surface of the first supporting structure, respectively.

In one embodiment of the invention, the optical module further includes: a transistor supported on the first substrate; a second supporting structure comprising a conductive upper surface, the second supporting structure being formed on the first substrate; a second line for electrically connecting the transistor and the second supporting structure; and a third bump provided on the second substrate, wherein the third bump is in contact with the upper surface of the second supporting structure.

According to still another aspect of the invention, an optical module includes: a first substrate; a vertical-cavity surface-emitting laser comprising an upper surface, a bottom surface which is in contact with the first substrate, and a semiconductor multi-layered structure including at least a light-emitting layer, the vertical-cavity surface-emitting laser being supported on the first substrate; a bipolar transistor formed on the upper surface of the vertical-cavity surface-emitting laser; an electrode structure electrically connected with the bottom surface of the vertical-cavity surface-emitting laser, the electrode structure being formed on the first substrate; and a second substrate comprising a first bump and a second bump. An upper surface of the electrode structure juts out from the first substrate, and the second substrate is positioned with respect to the first substrate so that the first bump and the second bump come into contact with an upper surface of the electrode structure and an upper surface of the bipolar transistor, respectively.

According to still another aspect of the invention, an optical module includes: a first substrate; a vertical-cavity surface-emitting laser comprising an upper surface, a bottom surface and a semiconductor multi-layered structure including at least a light-emitting layer, the vertical-cavity surface-emitting laser being supported on the first substrate; a bipolar transistor formed on the upper surface of the vertical-cavity surface-emitting laser; an electrode structure electrically connected with the bottom surface of the vertical-cavity surface-emitting laser, the electrode structure being supported on the first substrate; a first supporting structure comprising a conductive upper surface, the first supporting structure being supported on the first substrate; a first line for electrically connecting the bipolar transistor and the upper surface of the first supporting structure; and a second substrate comprising a first bump and a second bump. An upper surface of the electrode structure and the upper surface of the supporting structure jut out from the first substrate, and the second substrate is positioned with respect to the first substrate so that the first bump and the second bump come into contact with an upper surface of the electrode structure and the upper surface of the first supporting structure, respectively.

In one embodiment of the invention, the first supporting structure is formed close to the vertical-cavity surface-emitting laser.

In one embodiment of the invention, the first supporting structure comprises: the same semiconductor layers as the semiconductor layers of the semiconductor multi-layered structure; an insulating layer provided on the semiconductor layers; and an electrode structure provided on the insulating layer.

In one embodiment of the invention, the first supporting structure at least comprises: the same semiconductor layers as the semiconductor layers of the semiconductor multi-layered structure; and a metallic film provided on the semiconductor layers.

In one embodiment of the invention, a distance between the first substrate and the upper surface of the first supporting structure is longer than a distance between the first substrate and the upper surface of the vertical-cavity surface-emitting laser.

In one embodiment of the invention, the bipolar transistor is a field-effect transistor.

In one embodiment of the invention, the bipolar transistor is a heterojunction bipolar transistor.

In one embodiment of the invention, a gap between the first substrate and the second substrate is filled with an adhesive.

In one embodiment of the invention, the adhesive is made of a thermosetting resin.

In one embodiment of the invention, the adhesive is made of an ultraviolet curable resin.

In one embodiment of the invention, the optical module includes a plurality of electrode structures and a plurality of vertical-cavity surface-emitting lasers, wherein the plurality of electrode structures are disposed at respective vertexes of a polygon and the plurality of vertical-cavity surface-emitting lasers are disposed inside the polygon on the first substrate.

In one embodiment of the invention, the first bump and the second bump are made of a metal having a melting point of 350° C. or lower.

In one embodiment of the invention, the first bump and the second bump are made of bismuth.

In one embodiment of the invention, the upper surface of the vertical-cavity surface-emitting laser and the upper surface of the electrode structure are made of a metal having a melting point of 350° C. or lower.

In one embodiment of the invention, the upper surface of the vertical-cavity surface-emitting laser and the upper surface of the electrode structure are made of bismuth.

In one embodiment of the invention, the vertical-cavity surface-emitting laser further comprises a first Bragg reflector and a second Bragg reflector which are formed by a semiconductor multi-layered structure and disposed so as to interpose the light-emitting layer.

In one embodiment of the invention, a guiding groove to receive an optical fiber is provided in a reverse side of the first substrate in a portion corresponding to the position at which the vertical-cavity surface emitting laser is provided.

Thus, the invention described herein makes possible the advantage of providing a surface-emitting laser device excellent in the radiation characteristics and the emission characteristics to be obtained by a mounting technique for bonding a vertical-cavity surface-emitting laser with a submount by applying a small load and eliminating the necessity of plating the laser with gold.

This and other advantages of the present invention will become apparent to those skilled in the art upon reading and understanding the following detailed description with reference to the accompanying figures.

BRIEF DESCRIPTION OF THE DRAWINGS

FIGS. 3A to 3F are cross-sectional views illustrating a method for producing the optical module shown in FIG. 1.

DESCRIPTION OF THE PREFERRED EMBODIMENTS

Hereinafter, the present invention will be described by way of illustrative examples with reference to accompanying drawings.

EXAMPLE 1

Figure 1:
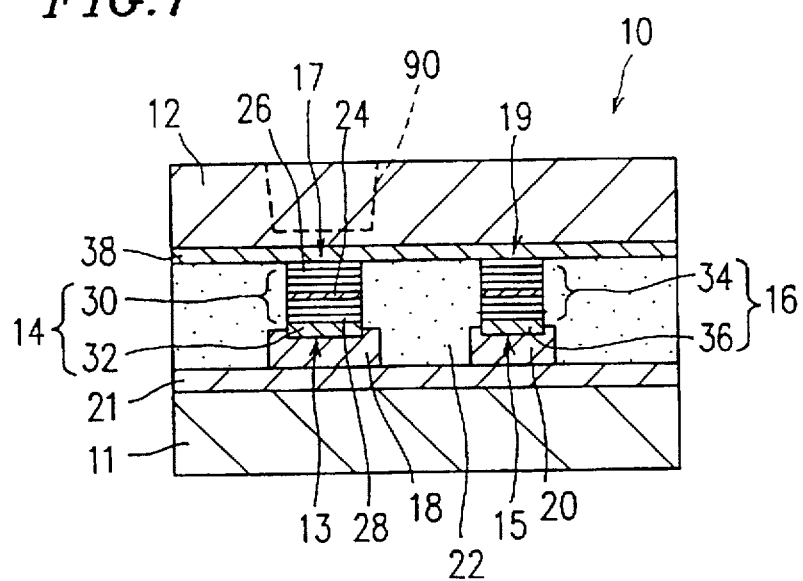
FIG. 1 is a cross-sectional view showing a configuration of an optical module according to a first example of the present invention.

FIG. 1 is a cross-sectional view of an optical module 10 according to an example of the present invention. The optical module 10 includes: a first substrate 12 made of an n-type GaAs semiconductor; a vertical-cavity surface-emitting laser 14 and an electrode structure 16 which are supported by the first substrate 12; and a second substrate 11 made of silicon. The second substrate 11 functions as a submount. The surface of the second substrate 11 is covered with an insulating film 21 made of silicon nitride, silicon oxide or the like, and micro bumps 18 and 20 are provided on the second substrate 11 via the insulating film 21. Though not shown in FIG. 1, the micro bumps 18 and 20 are connected with lines including pads.

The upper surface 13 of the vertical-cavity surface-emitting laser 14 and the upper surface 15 of the electrode structure 16 jut out from the first substrate 12. The micro bumps 18 and 20 also jut out from the second substrate 11. As a result, the first substrate 12 and the second substrate 11 are positioned so that the micro bumps 18 and 20 are in contact with the upper surface 13 of the vertical-cavity surface-emitting laser 14 and the upper surface 15 of the electrode structure 16, respectively. The gap between the first substrate 12 and the second substrate 11 is filled with an ultraviolet (UV) curable resin 22.

The vertical-cavity surface-emitting laser 14 includes: a light-emitting layer 24; a semiconductor multi-layered structure 30 including an n-type Bragg reflector 26 and a p-type Bragg reflector 28 which are provided so as to interpose the light-emitting layer 24 therebetween; and an electrode 32 provided on the semiconductor multi-layered structure 30.

The light emitted from the light-emitting layer 24 is preferably transparent to at least one of the first substrate 12 and the second substrate 11. In the case where the light emitted from the light-emitting layer 24 is not transparent to the first substrate 12, a groove 90 can be provided at a region of the reverse surface of the first substrate 12 where the vertical-cavity surface-emitting laser 14 is positioned. The groove 90 also enables emission of the light from the bottom thereof.

The electrode structure 16 includes: a semiconductor multi-layered structure 34 consisting of the same semiconductor layers as those of the semiconductor multi-layered structure 30; and an electrode 36 provided on the semiconductor multi-layered structure 34. The p-n junction formed in the semiconductor multi-layered structure 34 has been broken and the upper surface 15 and the bottom surface 19 of the electrode structure 16 are connected with each other at a low resistance. The vertical-cavity surface-emitting laser 14 and the electrode structure 16 are provided on the first substrate 12 via a buffer layer 38 made of n-type GaAs with a low resistance. Therefore, the bottom surface 17 of the vertical-cavity surface-emitting laser 14 and the bottom surface 19 of the electrode structure 16 are in contact with the buffer layer 38, and are electrically connected with each other.

The micro bumps 18 and 20 are preferably made of a material excellent in the thermal conductivity. More preferably, the material contains Au excellent in the thermal conductivity.

Figure 2:
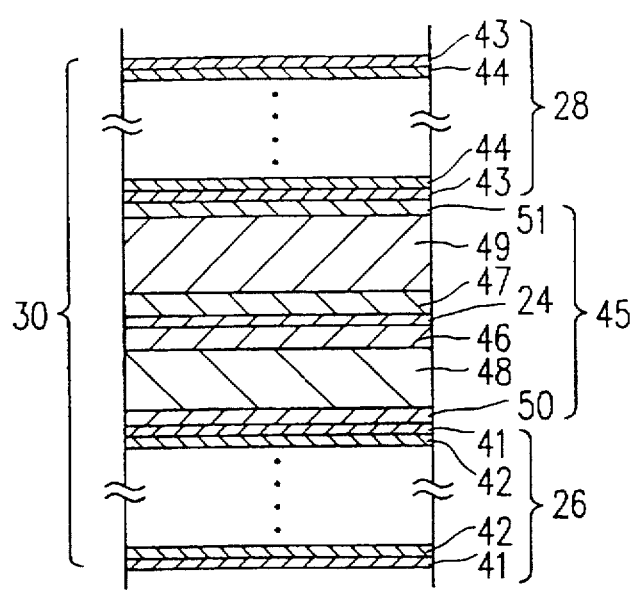
FIG. 2 is a cross-sectional view showing a configuration of a vertical-cavity surface-emitting laser used for the optical module shown in FIG. 1.

Referring to FIG. 2, a more detailed structure of the vertical-cavity surface-emitting laser 14 will be described. As shown in FIG. 2, the n-type Bragg reflector 26 includes 24.5 pairs of alternately stacked layers consisting of n-type AlAs layers 41 and n-type GaAs layers 42. In the same way, the p-type Bragg reflector 28 includes 24.5 pairs of alternately stacked layers consisting of p-type AlAs layers 43 and p-type GaAs layers 44. An active region 45 is provided between the n-type Bragg reflector 26 and the p-type Bragg reflector 28.

The active region 45 includes: a light-emitting layer 24; a pair of barrier layers 46 and 47; and spacer layers 48, 49, 50 and 51. The light-emitting layer 24 is interposed between the pair of barrier layers 46 and 47, and the barrier layers 46 and 47 are interposed between two pairs of spacer layers 48/50 and 49/51. The light-emitting layer 24 and the barrier layers 46 and 47 are made of undoped $In_{0.2}Ga_{0.8}As$ and undoped GaAs, respectively. The spacer layers 48 and 49 are made of undoped $Al_{0.5}Ga_{0.5}As$ and the spacer layers 50 and 51 are made of an n-type $Al_{0.5}Ga_{0.5}As$ and p-type $Al_{0.5}Ga_{0.5}As$, respectively. The electrons and the holes are collected in the light-emitting layer 24 by the barrier layers 46 and 47. The pacer layers 48, 49, 50 and 51 are provided in order to adjust the length of the vertical cavity of the laser and obtain a laser oscillation in a single longitudinal mode. The thicknesses of these semiconductor layers and the impurity concentrations thereof are shown in following Table 1.

TABLE 1

| Layer | Composition | Thickness (nm) | Impurity concentration (cm$^{-3}$) |
|---|---|---|---|
| p-type GaAs layer 44 | p-GaAs | 69.6 | Be: $1 \times 10^{18}$ |
| p-type AlAS layer 43 | p-AlAs | 82.8 | Be: $1 \times 10^{18}$ |
| spacer layer 51 | p-$Al_{0.5}Ga_{0.5}As$ | 86 | Be: $1.5 \times 10^{18}$ |
| spacer layer 49 | u-$Al_{0.5}Ga_{0.5}As$ | 50 | |
| barrier layer 47 | u-GaAs | 10 | |

TABLE 1-continued

| Layer | Composition | Thickness (nm) | Impurity concentration (cm$^{-3}$) |
|---|---|---|---|
| light-emitting layer 24 | u-In$_{0.2}$Ga$_{0.8}$As | 8 | |
| barrier layer 46 | u-GaAs | 10 | |
| spacer layer 48 | u-Al$_{0.5}$Ga$_{0.5}$As | 50 | |
| spacer layer 50 | n-Al$_{0.5}$Ga$_{0.5}$As | 86 | Si: 1.5 × 10$^{18}$ |
| n-type GaAs layer 42 | n-GaAs | 69.6 | Si: 1 × 10$^{18}$ |
| n-type AlAs layer 41 | n-AlAs | 82.8 | Si: 1 × 10$^{18}$ |

Referring to FIG. 1 again, in the optical module 10, a positive power supply and a negative power supply are connected with the lines connected with the micro bump 18 and the lines connected with the micro bump 20, respectively, so that a positive voltage is applied to the electrode 32 of the vertical-cavity surface-emitting laser 14 while a negative voltage is applied to the electrode 36 of the electrode structure 16.

Since the electrode structure 16 is electrically connected with the bottom surface 17 of the vertical-cavity surface-emitting laser 14 via the buffer layer 38, a positive voltage and a negative voltage are applied to the p-type distributed Bragg reflector 28 and the n-type distributed Bragg reflector 26, respectively. As a result, the vertical-cavity surface-emitting laser 14 can emit light.

The optical module 10 is produced, for example, by the following method.

First, as shown in FIGS. 3A and 3B, a buffer layer 38 and a semiconductor multi-layered structure 30 including the semiconductor layers 24 and 41 to 51 shown in FIG. 2 are epitaxially grown on a first substrate 12 made of n-type GaAs by a molecular beam epitaxy (MBE) method or the like. Next, as shown in FIG. 3C, the semiconductor multi-layered structure 30 is partially etched by a dry etching method using a mixture gas containing chlorine until the buffer layer 38 is exposed. Then, electrodes 32 and 36 are formed on the semiconductor multi-layered structure 30, thereby forming a vertical-cavity surface-emitting laser 14 and an electrode structure 16. The p-n junction in the semiconductor multi-layered structure 30 forming the electrode structure 16 is broken beforehand by applying a high electric field between the buffer layer 38 and the electrode 36. As a result, the electrode structure 16 with a low resistance can be formed.

Next, as shown in FIG. 3D, an insulating film 21 made of silicon oxide is formed on the second substrate 11 made of silicon positioned on a supporting plate 53, and micro bumps 18 and 20 made of Ti/Pd/Au or the like are formed thereon. Though not shown in FIG. 3D, lines including pads for applying a voltage are connected with the micro bumps 18 and 20. Subsequently, a UV curable resin 22 is applied onto the insulating film 21 so as to cover the micro bumps 18 and 20. Thereafter, the first substrate 12 is stuck onto a vacuum collet 52, and then positioned with respect to the second substrate 11 so that the micro bumps 18 and 20 are opposed to the vertical-cavity surface-emitting laser 14 and the electrode structure 16, respectively.

Next, as indicated by the arrow shown in FIG. 3D, the first substrate 12 is pressed against the second substrate 11 so that the upper surface 13 of the electrode 32 on the vertical-cavity surface-emitting laser 14 and the upper surface 15 of the electrode 36 on the electrode structure 16 come into contact with the micro bumps 18 and 20, respectively. As a result, as shown in FIG. 3E, the UV curable resin 22 between the micro bump 18 and the vertical-cavity surface-emitting laser 14 and between the micro bump 20 and the electrode structure 16 is removed. While maintaining this state, the UV curable resin 22 is irradiated with UV rays. The irradiation of the UV rays causes the shrinkage of the UV curable resin 22 and attaches the first substrate 12 and the second substrate 11 with each other. The electrode 32 on the vertical-cavity surface-emitting laser 14 and the electrode 36 on the electrode structure 16 securely come into contact with the micro bumps 18 and 20, respectively, so that satisfactory electrical bonding can be formed. The electrodes 32 and 36 preferably have a thickness of 200 nm or more, and the micro bumps 18 and 20 preferably have a thickness of 500 nm or more. An optimal bonding can be obtained when the thickness of the electrodes 32 and 36 is 2 µm or more and when the thickness of the micro bumps 18 and 20 is 5 µm or more. As a result, the optical module 10 shown in FIG. 3F is completed.

According to the present invention, the first substrate 12 and the second substrate 11 are attached with the shrinkage force of the UV curable resin 22 exerted to the entire portion of the first substrate 12 and the second substrate 11. Therefore, it is possible to reduce the load applied to the upper surface of the vertical-cavity surface-emitting laser, and reduce the distortion to be given to the light-emitting layer 24 by the load during the mounting process, thereby preventing the decrease in the emission efficiency. In addition, the heat generated in the light-emitting layer can be radiated through the micro bumps into the second substrate, thereby realizing excellent radiation characteristics.

In the above-described example, the electrode structure 16 consists of the semiconductor multi-layered structure 34 in which the p-n junction has been broken and the electrode formed on the semiconductor multi-layered structure 34. Alternatively, the electrode structure 16 can be an other type of conductive structure. Hereinafter, another exemplary electrode structure will be described in detail.

Figure 4A:
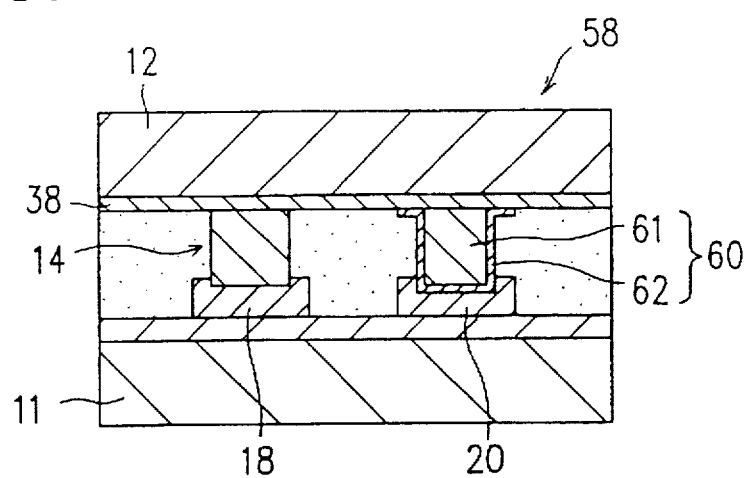
FIGS. 4A and 4B are cross-sectional views showing a variant of the electrode structure used for the optical module of the first example.

An optical module 58 shown in FIG. 4A includes an electrode structure 60 instead of the electrode structure 16 shown in FIG. 1. The electrode structure 60 includes: a body 61 constituted by a semiconductor multi-layered structure, an insulating layer or the like; and a conductive layer 62 provided at the surface of the body 61 so as to cover the upper and side surfaces thereof and electrically connected at least with the buffer layer 38. In order to obtain a low-resistance electrical contact between the conductive layer 62 and the buffer layer 38, the conductive layer 62 is preferably made of an ohmic electrode material such as AuGe/Ni or AuZn/Au.

Figure 4B:
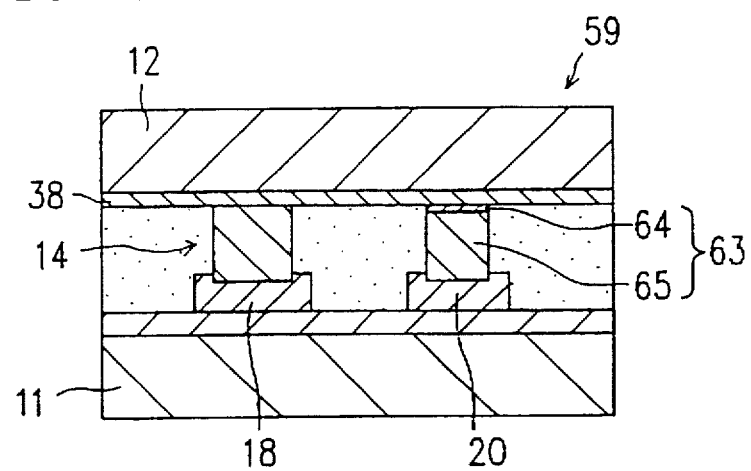

An optical module 59 shown in FIG. 4B includes an electrode structure 63 instead of the electrode structure 16 shown in FIG. 1. The electrode structure 63 includes: an ohmic electrode 64 formed on the buffer layer 38 and an Au layer 65 formed on the ohmic electrode 64 by a plating method.

In this example, an ultraviolet curable resin is used as an adhesive. Alternatively, a thermosetting resin can also be used.

The optical module of this example includes one vertical-cavity surface-emitting laser and one electrode structure. However, the optical module can include two or more vertical-cavity surface-emitting lasers and electrode structures.

Figure 5A:
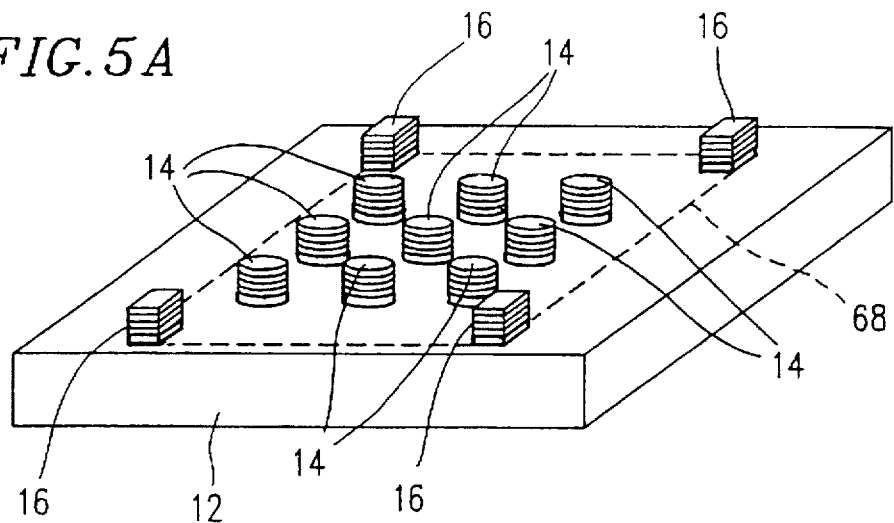
FIGS. 5A and 5B are perspective views showing the configurations of the first and the second substrates for constituting an optical module including a plurality of vertical-cavity surface-emitting lasers arranged in an array.
Figure 5B:
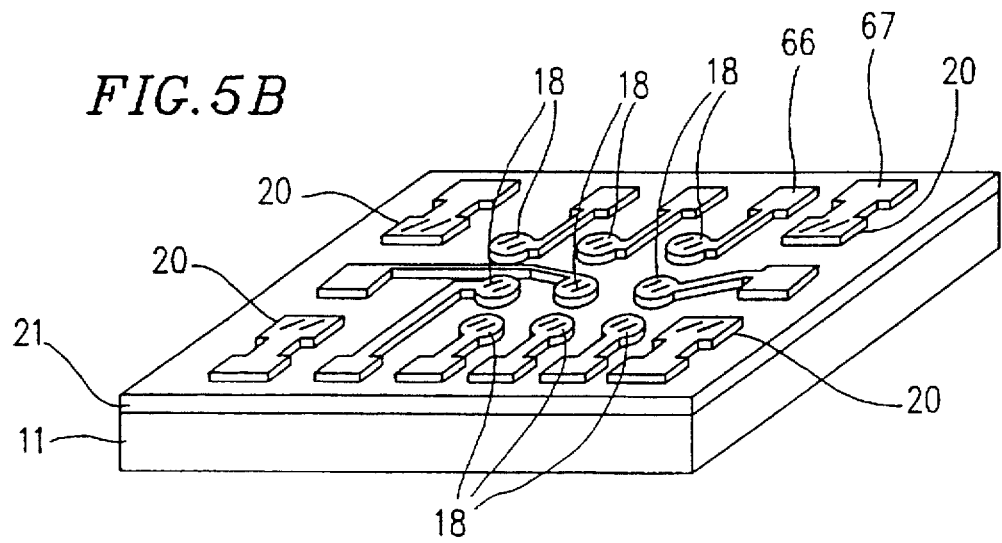

FIGS. 5A and 5B are perspective views showing the configurations of the first substrate 12 and the second substrate 11 for constituting an optical module including nine vertical-cavity surface-emitting lasers 14 and four electrode structures 16.

As shown in FIG. 5A, nine vertical-cavity surface-emitting lasers 14 arranged in the three rows and three columns are supported on the first substrate 12. The four electrode structures 16 are disposed at the four vertexes of the rectangle 68 surrounding the array of the vertical-cavity surface-emitting lasers 14.

As shown in FIG. 5B, micro bumps 18 and 20 are provided on the second substrate 11 via the insulating film 21 at the positions corresponding to those of the vertical-cavity surface-emitting lasers 14 and the electrode structures 16 provided on the first substrate 12. The lines 66 and 67 including the pads are connected with the micro bumps 18 and 20, respectively.

By disposing the vertical-cavity surface-emitting lasers 14 and the electrode structures 16 as shown in FIG. 5A, the load to be applied during the bonding of the first substrate 12 with the second substrate 11 is uniformly dispersed among the four electrode structures 16. Accordingly, when the vertical-cavity surface-emitting lasers 14 come into contact with the micro bumps 18, the vertical-cavity surface-emitting lasers 14 receive a uniform load, so that the degradation of the emission efficiency of the vertical-cavity surface-emitting lasers 14 can be suppressed as compared with the case of using the vertical-cavity surface-emitting laser 14 shown in FIG. 1.

EXAMPLE 2

Figure 6A:
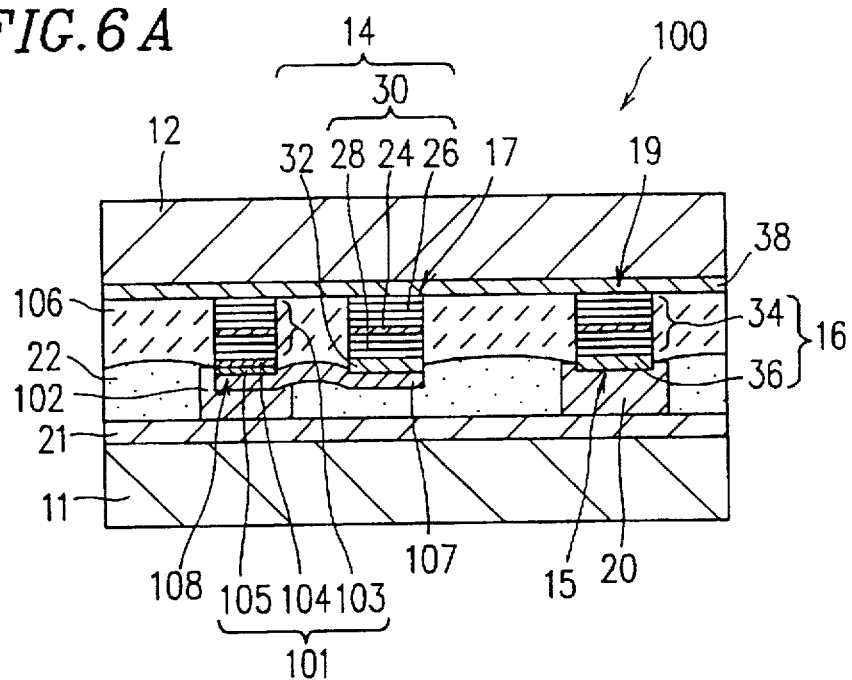
FIGS. 6A and 6B are cross-sectional views showing a configuration of an optical module according to second example of the present invention.
Figure 6B:
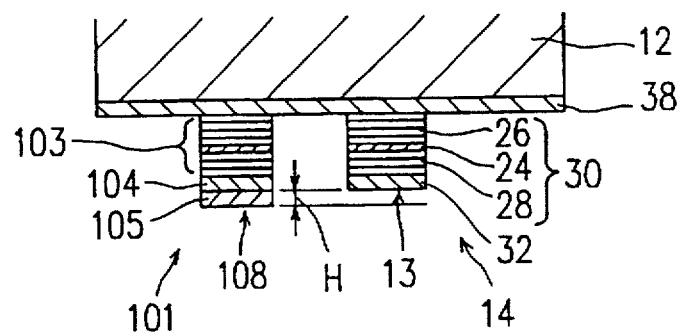

FIGS. 6A and 6B are cross-sectional views of an optical module 100 according to a second example of the present invention. In FIGS. 6A and 6B, the same components as those of the optical module 10 shown in FIG. 1 will be denoted by the same reference numerals.

The optical module 100 includes: a first substrate 12; a vertical-cavity surface-emitting laser 14, an electrode structure 16 and a supporting structure 101 which are supported by the first substrate 12 via a buffer layer 38; and a second substrate 11. The surface of the second substrate 11 is covered with an insulating film 21 made of silicon nitride, silicon oxide or the like, and micro bumps 20 and 102 are provided on the second substrate 11 via the insulating film 21. Though not shown in FIG. 6A, the micro bumps 20 and 102 are connected with lines including pads.

The vertical-cavity surface-emitting laser 14 includes: a light-emitting layer 24; a semiconductor multi-layered structure 30 including an n-type distributed Bragg reflector 26 and a p-type distributed Bragg reflector 28 which are provided so as to interpose the light-emitting layer 24 therebetween; and an electrode 32 provided on the semiconductor multi-layered structure 30.

The electrode structure 16 includes: a semiconductor multi-layered structure 34 consisting of the same semiconductor layers as those of the semiconductor multi-layered structure 30; and an electrode 36 provided on the semiconductor multi-layered structure 34. The p-n junction formed in the semiconductor multi-layered structure 34 has been broken and the upper surface 15 and the lower surface 19 of the electrode structure 16 are connected with each other at a low resistance.

The supporting structure 101 includes a semiconductor multi-layered structure 103 consisting of the same semiconductor layers as those of the semiconductor multi-layered structure 30. An insulating layer 104 is provided between the semiconductor multi-layered structure 103 and the electrode 105. The supporting structure 101 can be made of any material other than the material of the semiconductor multi-layered structure 103 so long as the upper surface 108 of the supporting structure 101 has a conductance and the portion between the buffer layer 38 on which the supporting structure 101 is formed and the upper surface 108 is electrically insulated.

A polyimide film 106 is provided so as to cover the buffer layer 38 on the first substrate 12. A line 107 is provided on the polyimide film 106 for electrically connecting the electrode 32 of the vertical-cavity surface-emitting laser 14 and the electrode 105 of the supporting structure 101. The polyimide film 106 is provided principally for retaining the line 107 at a predetermined distance from the surface of the first substrate 12, so that the difference in the height between the electrodes 32 and 105 becomes small. As a result, it is possible to prevent the disconnection of the line 107 caused by the discontinuity of the line 107 owing to the difference in the height between the electrodes 32 and 105.

The upper surface 108 of the supporting structure 101 and the upper surface 15 of the electrode structure 16 jut out from the first substrate 12, and the first substrate 12 and the second substrate 11 are positioned so that the micro bumps 20 and 102 are in contact with the upper surface 15 of the electrode structure 16 and the upper surface 108 of the supporting structure 101. The gap between the polyimide film 106 and the second substrate 11 is filled with a UV curable resin 22.

In the optical module 100, a positive power supply and a negative power supply are connected with the lines connected with the micro bump 102 and the lines connected with the micro bump 20, respectively, so that a positive voltage is applied to the line 107 while a negative voltage is applied to the electrode structure 16.

Since the line 107 is electrically connected with the electrode 32 of the vertical-cavity surface-emitting laser 14, and the electrode structure 16 is electrically connected with the bottom surface 17 of the vertical-cavity surface-emitting laser 14 via the buffer layer 38; a positive voltage and a negative voltage are applied to the p-type distributed Bragg reflector 28 and the n-type distributed Bragg reflector 26, respectively. As a result, the vertical-cavity surface-emitting laser 14 can emit light.

A principal feature of the optical module 100 lies in that the electrode structure 16 and the supporting structure 101 provided on the first substrate 12 are received by the micro bumps 20 and 102, respectively, so as to retain the second substrate 11. By using such a configuration, the first substrate 12 can be bonded with the second substrate 11 without applying a load to the vertical-cavity surface-emitting laser 14. Therefore, the vertical-cavity surface-emitting laser 14 can be mounted on the submount without applying a load to the light-emitting layer 24 of the vertical-cavity surface-emitting laser 14 and degrading the emission efficiency of the laser 14. In order to unfailingly not apply the load during the bonding to the vertical-cavity surface-emitting laser 14, the supporting structure 101 is preferably disposed close to the vertical-cavity surface-emitting laser 14, e.g., at a distance of 20 μm or less from the vertical-cavity surface-emitting laser 14. The electrodes 105 and 36 preferably have a thickness of 200 μm or more, and the micro bumps 102 and 20 preferably have a thickness of 500 nm or more. An optimal bonding can be obtained when the thickness of the electrodes 105 and 36 is 2 μm or more and when the thickness of the micro bumps 102 and 20 is 5 μm or more.

In addition, in order to unfailingly not apply a load to the vertical-cavity surface-emitting laser 14, the upper surface 108 of the supporting structure 101 is preferably higher than the upper surface 13 of the vertical-cavity surface-emitting laser 14 with respect to the buffer layer 38, as shown in FIG. 6B. Such a configuration can be realized by making the sum of the thickness of the insulating layer 104 and that of the electrode 105 larger than the thickness of the electrode 32. The difference in the height between the upper surfaces 108 and 13 is preferably 0.5 µm or more. In such a configuration, even when the supporting structure 101 is engaged into the micro bump 102, it is possible to unfailingly prevent both the contact between the upper surface 13 of the vertical-cavity surface-emitting laser 14 and the insulating film 21, and the application of a load to the light-emitting layer 24.

The optical module 100 is produced by almost the same method as that for producing the optical module 10 of the first example.

More specifically, when the semiconductor multi-layered structure 30 of the vertical-cavity surface-emitting laser 14 is formed by the D/E method, the semiconductor multi-layered structure 34 for the electrode structure 16 and the semiconductor multi-layered structure 103 for the supporting structure 101 are simultaneously formed. Thereafter, the insulating layer 104 is formed on the semiconductor multi-layered structure 103 and the electrodes 32, 36 and 105 are formed on the semiconductor multi-layered structures 30 and 34 and the insulating layer 104, respectively. After the polyimide film 106 is formed so as to cover the buffer layer 38, the line 107 for connecting the electrodes 32 and 105 is formed. Subsequently, the second substrate 11 is bonded with the first substrate 12 in the same way as in the first example.

In the optical module 100, the electrode structure 16 and the UV curable resin 22 can be modified in various manners as described in the first example.

Figure 7:
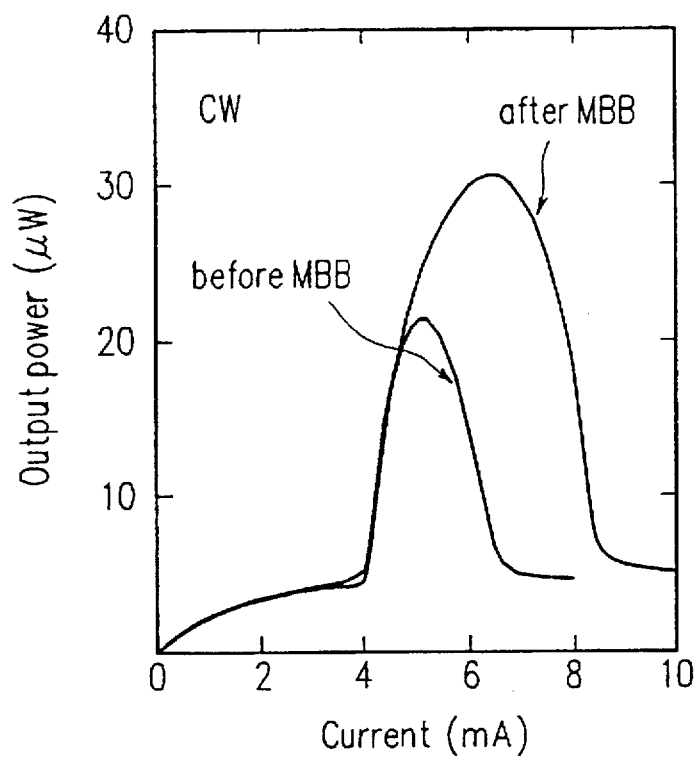
FIG. 7 is a graph showing an emission characteristic of the optical module shown in FIGS. 6A and 6B.

FIG. 7 is a graph showing an exemplary output power characteristic of the optical module 100 produced in the above-described manner. The output power characteristic of the laser device 100 before bonding the second substrate is also shown in FIG. 7 for comparison. As is apparent from FIG. 7, the maximum output power is about 21 mW before bonding the second substrate. On the other hand, after the second substrate is bonded, the maximum output power increases up to about 32 mW. This is because the emission efficiency can be improved by bonding the second substrate with the first substrate via the micro bumps. That is to say, the heat generated in the vertical-cavity surface-emitting laser has been radiated through the polyimide film 106 and the UV curable resin 22 into the first substrate 12 and the second substrate 11.

Figure 8:
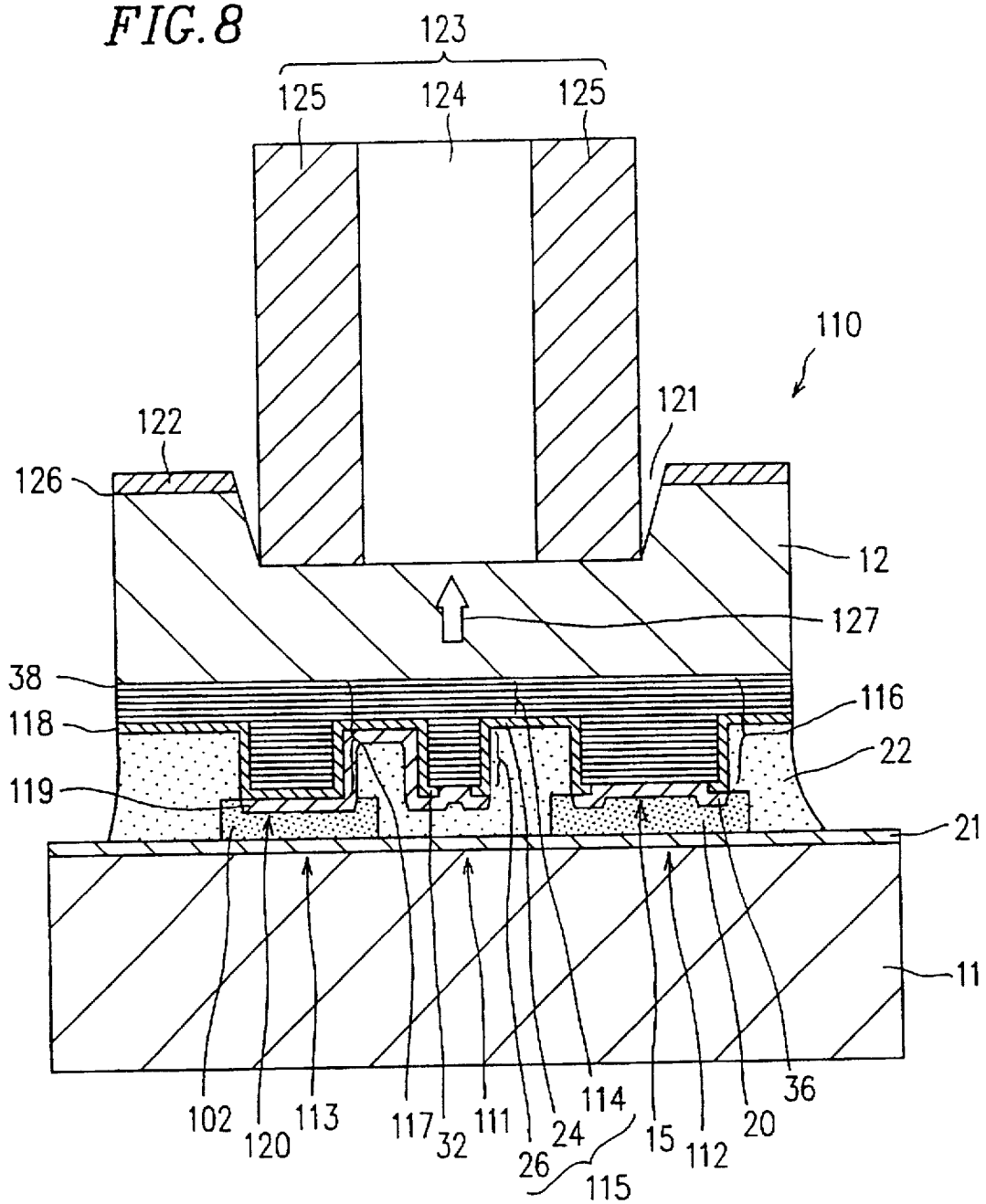
FIG. 8 is a cross-sectional view showing the interconnection between the optical module of the second example and an optical fiber.

The optical module having the above-described configuration can be suitably combined with an optical fiber. FIG. 8 schematically shows the cross section of an optical module 110 which can be connected with an optical fiber.

The optical module 110 includes: a first substrate 12; a vertical-cavity surface-emitting laser 111, an electrode structure 112 and a supporting structure 113 which are supported by the first substrate 12; and a second substrate 11. The surface of the second substrate 11 is covered with an insulating film 21 made of silicon nitride, silicon oxide or the like, and micro bumps 20 and 102 are provided on the second substrate 11 via the insulating film 21. Though not shown in FIG. 8, the micro bumps 20 and 102 are connected with lines including pads.

The vertical-cavity surface-emitting laser 111 includes: a light-emitting layer 24; a semiconductor multi-layered structure 115 including an n-type distributed Bragg reflector 26 and a part of a p-type distributed Bragg reflector 114 which are provided so as to interpose the light-emitting layer 24 therebetween; and an electrode 32 provided on the semiconductor multi-layered structure 115. The p-type distributed Bragg reflector 114 is formed so as to cover the entire surface of the first substrate 12.

The electrode structure 112 includes: a semiconductor multi-layered structure 116 consisting of the same semiconductor layers as those of the semiconductor multi-layered structure 115; and an electrode 36 provided on the semiconductor multi-layered structure 116. The semiconductor multi-layered structure 116 includes a part of the p-type distributed Bragg reflector 114 and the p-n junction formed in the semiconductor multi-layered structure 116 has been broken.

The supporting structure 113 includes: a semiconductor multi-layered structure 117 consisting of the same semiconductor layers as those of the semiconductor multi-layered structure 115; a part of an insulating layer 118 covering the semiconductor multi-layered structure 117; and a part of the line 119 provided on the insulating layer 118. The insulating layer 118 is further formed on the p-type distributed Bragg reflector 114 so as to cover the sides of the vertical-cavity surface-emitting laser 111 and the electrode structure 112. The line 119 is connected with the electrode 32 of the vertical-cavity surface-emitting laser 111.

The upper surface 15 of the electrode structure 112 and the upper surface 120 of the supporting structure 113 jut out from the first substrate 12. The first substrate 12 and the second substrate 11 are positioned so that the micro bumps 20 and 102 are in contact with the upper surface 15 of the electrode structure 112 and the upper surface 120 of the supporting structure 113. The gap between the first substrate 12 and the second substrate 11 is filled with a UV curable resin 22.

A guiding groove 121 is provided in a reverse side 126 of the first substrate 12 in a portion corresponding to the position at which the vertical-cavity surface-emitting laser 111 is provided, and a silicon oxide film 122 is formed around the guiding groove 121. A multi-mode optical fiber 123 including a core 124 and a cladding layer 125, is inserted into the guiding groove 121. The light 127 emitted from the vertical-cavity surface-emitting laser 111 is transmitted through the first substrate 12 and then incident onto the core 124.

By using such a configuration, all the lines required for driving the vertical-cavity surface-emitting laser 111 can be formed on the second substrate 11, and a space for connecting the optical fiber can be secured in the reverse side 126 of the first substrate 12. In addition, it is easy to align the multi-mode optical fiber 123 with the vertical-cavity surface-emitting laser 111 since the guiding groove 121 having a large depth can be provided in the reverse side 126 of the first substrate 12. Accordingly, even if a plurality of vertical-cavity surface-emitting lasers 111 are arranged in an array on the first substrate 12, a plurality of optical fibers can be easily connected with the lasers 111, thereby providing an optical module 110 suitable for being interconnected with an optical fiber.

EXAMPLE 3

Figure 9:
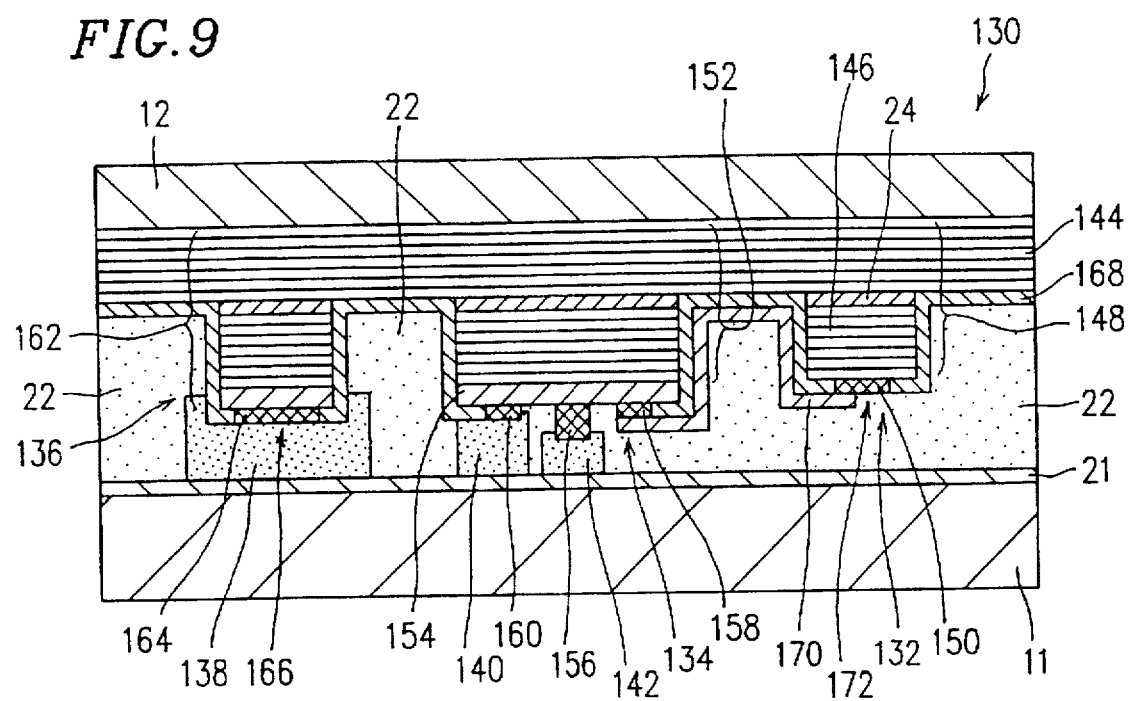
FIG. 9 is a cross-sectional view showing a configuration of an optical module according to a third example of the present invention.

FIG. 9 is a cross-sectional view of a an optical module 130 according to a third example of the present invention. The optical module 130 includes: a first substrate 12; a vertical-cavity surface-emitting laser 132, an electrode structure 136 and a field-effect transistor (hereinafter, simply referred to as an "FET") 134 which are supported by the first substrate 12; and a second substrate 11. The surface of the second substrate 11 is covered with an insulating film 21 made of silicon nitride, silicon oxide or the like, and micro bumps 138, 140 and 142 are provided on the second substrate 11 via the insulating film 21. Though not shown in FIG. 9, the micro bumps 138, 140 and 142 are connected with lines including pads.

The vertical-cavity surface-emitting laser 132 includes: a light-emitting layer 24; a semiconductor multi-layered structure 148 including a part of an n-type distributed Bragg reflector 144 and a p-type distributed Bragg reflector 146 which are provided so as to interpose the light-emitting layer 24 therebetween; and an electrode 150 provided on the semiconductor multi-layered structure 148. The n-type distributed Bragg reflector 144 is formed so as to cover the entire surface of the first substrate 12.

The FET 134 includes: an n-type channel layer 154; a gate electrode 156 provided on the n-type channel layer 154; a source electrode 158; and a drain electrode 160. The channel layer 154 is formed on the semiconductor multi-layered structure 152 consisting of the same semiconductor layers as those of the semiconductor multi-layered structure 148.

The electrode structure 136 includes: a semiconductor multi-layered structure 162 consisting of the same semiconductor layers as those of the semiconductor multi-layered structure 152 and the channel layer 154; and an electrode 164 provided on the semiconductor multi-layered structure 162. The semiconductor multi-layered structure 162 includes a part of the n-type distributed Bragg reflector 144 and the p-n junction formed in the semiconductor multi-layered structure 162 has been broken. As a result, the upper surface 166 of the electrode structure 136 is connected with the n-type distributed Bragg reflector 144 of the vertical-cavity surface-emitting laser 132 at a low resistance.

The sides of the vertical-cavity surface-emitting laser 132, the FET 134 and the electrode structure 136 and the surface of the n-type distributed Bragg reflector 144 are covered with an insulating film 168 made of silicon oxide, silicon nitride or the like. A line 170 for electrically connecting the electrode 150 of the vertical-cavity surface-emitting laser 132 with the source electrode 158 is provided on the insulating film 168.

The upper surface 166 of the electrode structure 136 juts out from the n-type distributed Bragg reflector 144 formed on the first substrate 12. The first substrate 12 and the second substrate 11 are positioned so that the micro bumps 138, 140 and 142 are in contact with the upper surface 166 of the electrode structure 136, the drain electrode 160 and the gate electrode 156, respectively. The gap between the first substrate 12 and the second substrate 11 is filled with a UV curable resin 22.

In the optical module 130, a current flows between the drain electrode 160 and the source electrode 158 based on the voltage applied to the gate electrode 156, and a voltage is applied to the vertical-cavity surface-emitting laser 132 via the line 170. On the other hand, a voltage is also applied to the n-type distributed Bragg reflector 144 via the electrode structure 136, so that the vertical-cavity surface-emitting laser 132 can emit light.

In this configuration, since the upper surface 172 of the vertical-cavity surface-emitting laser 132 does not come into contact with the micro bumps, it is possible to bond the second substrate 11 with the first substrate 12 without applying a load to the light-emitting layer 24.

In the above-described example, the optical module includes a field-effect transistor. As will be described below, a heterojunction bipolar transistor can be used instead of the field-effect transistor.

Figure 10:
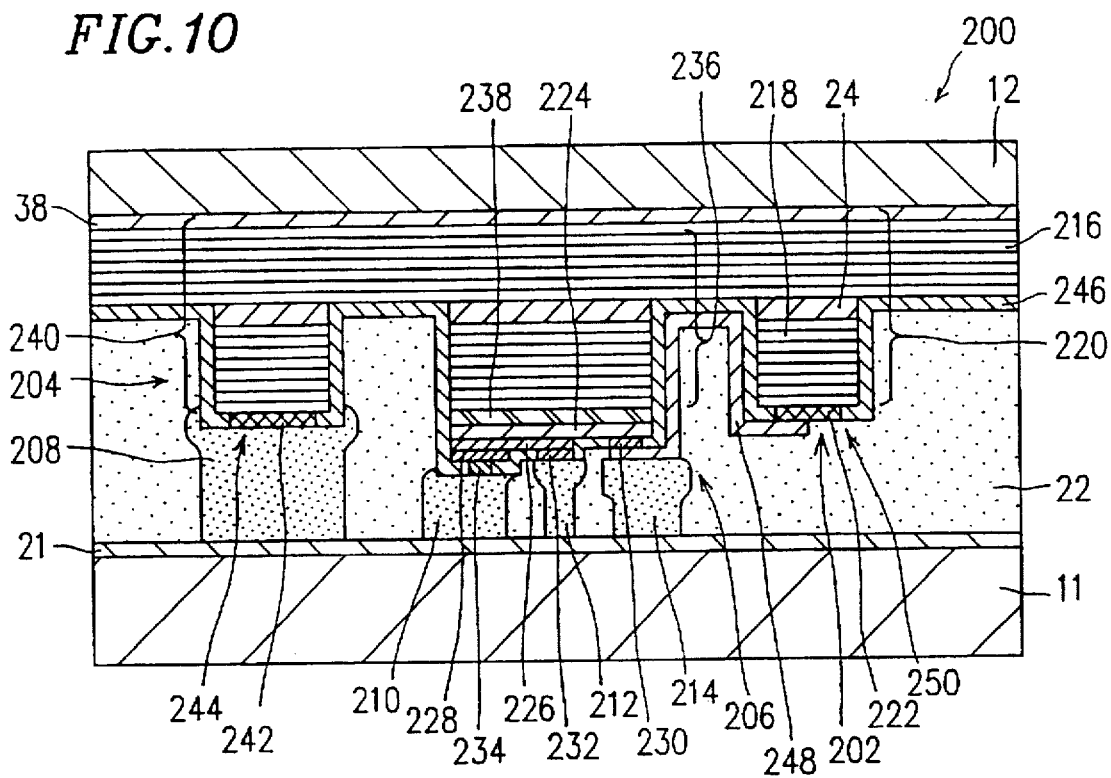
FIG. 10 is a cross-sectional view showing a configuration of another optical module according to the third example of the present invention.

FIG. 10 is a cross-sectional view of a an optical module 200. The optical module 200 includes: a first substrate 12; a vertical-cavity surface-emitting laser 202, an electrode structure 204 and a heterojunction bipolar transistor 206 which are supported by the first substrate 12 via a buffer layer 38; and a second substrate 11. The surface of the second substrate 11 is covered with an insulating film 21 made of silicon nitride, silicon oxide or the like, and micro bumps 208, 210, 212 and 214 are provided on the second substrate 11 via the insulating film 21. Though not shown in FIG. 10, the micro bumps 208, 210, 212 and 214 are connected with lines including pads.

The vertical-cavity surface-emitting laser 202 includes: a light-emitting layer 24; a semiconductor multi-layered structure 220 including a part of a p-type distributed Bragg reflector 216 and an n-type distributed Bragg reflector 218 which are provided so as to interpose the light-emitting layer 24 therebetween; and an electrode 222 provided on the semiconductor multi-layered structure 220. The p-type distributed Bragg reflector 216 is formed so as to cover the entire surface of the buffer layer 38.

The heterojunction bipolar transistor 206 includes: a collector layer 224; a base layer 226; an emitter layer 228; and a collector electrode 230, a base electrode 232 and an emitter electrode 234 electrically connected with these semiconductor layers 224, 226 and 228, respectively. The base layer 226 is interposed between the emitter layer 228 and the collector layer 224. The collector layer 224 is formed on the semiconductor multi-layered structure 236 consisting of the same semiconductor layers as those of the semiconductor multi-layered structure 220 via a buffer layer 238.

The electrode structure 204 includes: a semiconductor multi-layered structure 240 consisting of the same semiconductor layers as those of the semiconductor multi-layered structure 220; and an electrode 242 provided on the semiconductor multi-layered structure 240. The semiconductor multi-layered structure 240 includes a part of the p-type distributed Bragg reflector 216 and the p-n junction formed in the semiconductor multi-layered structure 240 has been broken. As a result, the upper surface 244 of the electrode structure 204 is connected with the p-type distributed Bragg reflector 216 of the vertical-cavity surface-emitting laser 202 at a low resistance.

The sides of the vertical-cavity surface-emitting laser 202, the heterojunction bipolar transistor 206, and the electrode structure 204 and the surface of the p-type distributed Bragg reflector 216 are covered with an insulating film 246 made of silicon oxide, silicon nitride or the like. A line 248 for electrically connecting the electrode 222 of the vertical-cavity surface-emitting laser 202 with the collector electrode 230 is provided on the insulating film 246.

The upper surface 244 of the electrode structure 204 juts out from the p-type distributed Bragg reflector 216 formed on the first substrate 12. The first substrate 12 and the second substrate 11 are positioned so that the micro bumps 208, 210, 212 and 214 are in contact with the upper surface 244 of the electrode structure 204, the emitter electrode 234, the base electrode 232 and the collector electrode 230, respectively. The gap between the first substrate 12 and the second substrate 11 is filled with a UV curable resin 22.

In the optical module 200, a current flows between the emitter electrode 234 and the collector electrode 230 based on the voltage or the current applied to the base electrode 232 via the micro bump 212, and a voltage is applied to the n-type distributed Bragg reflector 218 of the vertical-cavity surface-emitting laser 202 via the line 248. On the other hand, a voltage is also applied to the p-type distributed Bragg reflector 216 via the electrode structure 204, so that the vertical-cavity surface-emitting laser 202 can emit light.

In this configuration, since the upper surface 250 of the vertical-cavity surface-emitting laser 202 does not come into contact with the micro bumps, it is possible to bond the second substrate 11 with the first substrate 12 without applying a load to the light-emitting layer 24.

In addition, as will be described below, the heterojunction bipolar transistor can be formed on the vertical-cavity surface-emitting laser.

Figure 11:
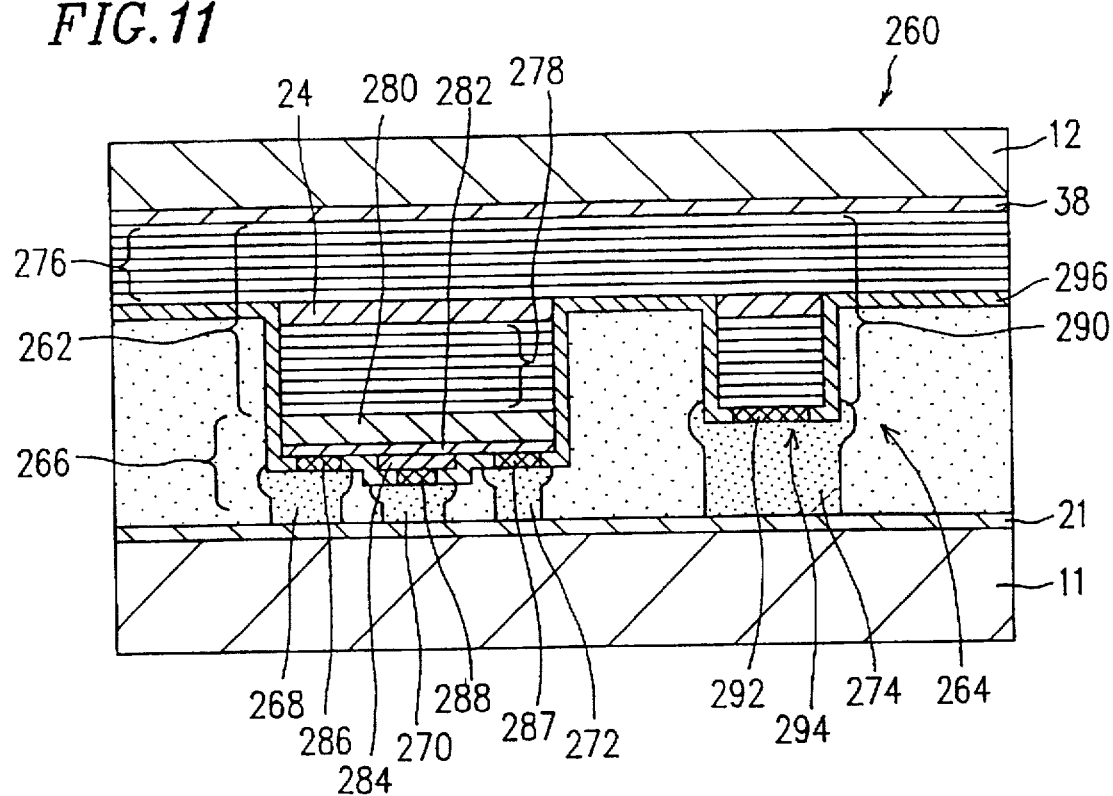
FIG. 11 is a cross-sectional view showing a configuration of still another optical module according to the third example of the present invention.

FIG. 11 is a cross-sectional view of an optical module 260. The optical module 260 includes: a first substrate 12; a vertical-cavity surface-emitting laser 262 and an electrode structure 264 which are supported by the first substrate 12 via a buffer layer 38; a heterojunction bipolar transistor 266 formed on the vertical-cavity surface-emitting laser 262; and a second substrate 11. The surface of the second substrate 11 is covered with an insulating film 21 made of silicon nitride, silicon oxide or the like, and micro bumps 268, 270, 272 and 274 are provided on the second substrate 11 via the insulating film 21. Though not shown in FIG. 11, the micro bumps 268, 270, 272 and 274 are connected with lines including pads.

The vertical-cavity surface-emitting laser 262 includes: a light-emitting layer 24; and a part of a p-type distributed Bragg reflector 276 and an n-type distributed Bragg reflector 278 which are provided so as to interpose the light-emitting layer 24 therebetween. The p-type distributed Bragg reflector 276 is formed so as to cover the entire surface of the buffer layer 38.

The heterojunction bipolar transistor 266 includes: a collector layer 280; a base layer 282; an emitter layer 284; base electrodes 286 and 287 electrically connected with the base layer 282; and an emitter electrode 288 electrically connected with the emitter layer 284. The base layer 282 is interposed between the emitter layer 284 and the collector layer 280. The collector layer 280 is formed on the n-type distributed Bragg reflector 278 of the vertical-cavity surface-emitting laser 262.

The electrode structure 264 includes: a semiconductor multi-layered structure 290 consisting of the same semiconductor layers as those of the vertical-cavity surface-emitting laser 262; and an electrode 292 provided on the semiconductor multi-layered structure 290. The semiconductor multi-layered structure 290 includes a part of the p-type distributed Bragg reflector 276 and the p-n junction formed in the semiconductor multi-layered structure 290 has been broken. As a result, the upper surface 294 of the electrode structure 264 is connected with the p-type distributed Bragg reflector 276 of the vertical-cavity surface-emitting laser 262 at a low resistance.

The sides of the vertical-cavity surface-emitting laser 262, the heterojunction bipolar transistor 266, and the electrode structure 264 and the surface of the p-type distributed Bragg reflector 276 are covered with an insulating film 296 made of silicon oxide, silicon nitride or the like.

The upper surface 294 of the electrode structure 264 juts out from the first substrate 12, and the first substrate 12 and the second substrate 11 are positioned so that the micro bumps 268, 270, 272 and 274 are in contact with the base electrode 286, the emitter electrode 288, the base electrode 287 and the upper surface 294 of the electrode structure 264, respectively. The gap between the first substrate 12 and the second substrate 11 is filled with a UV curable resin 22.

In the optical module 260, negative charges are applied from the micro bump 270 to the n-type distributed Bragg reflector 278 via the emitter layer 284, the base layer 282 and the collector layer 280 based on the voltage applied from the micro bumps 268 and 272 to the base layer 282 via the base electrodes 286 and 287. On the other hand, a positive voltage is applied from the micro bump 274 to the p-type distributed Bragg reflector 276 via the electrode structure 264, so that the vertical-cavity surface-emitting laser 262 can emit light.

In the above-explained example, the optical module includes at least two micro bumps provided on the second substrate so as to receive at least two terminals of an FET or a bipolar transistor. However, it is not necessary to provide an optical module of the present invention with a micro bump which directly receives such a terminal of a transistor. For example, in the case where an optical module further includes an active element or passive element, the terminals of a transistor can connected with the active elements or the passive element and do not have to be directly connected with micro bumps formed on the second substrate.

EXAMPLE 4

Figure 12A:
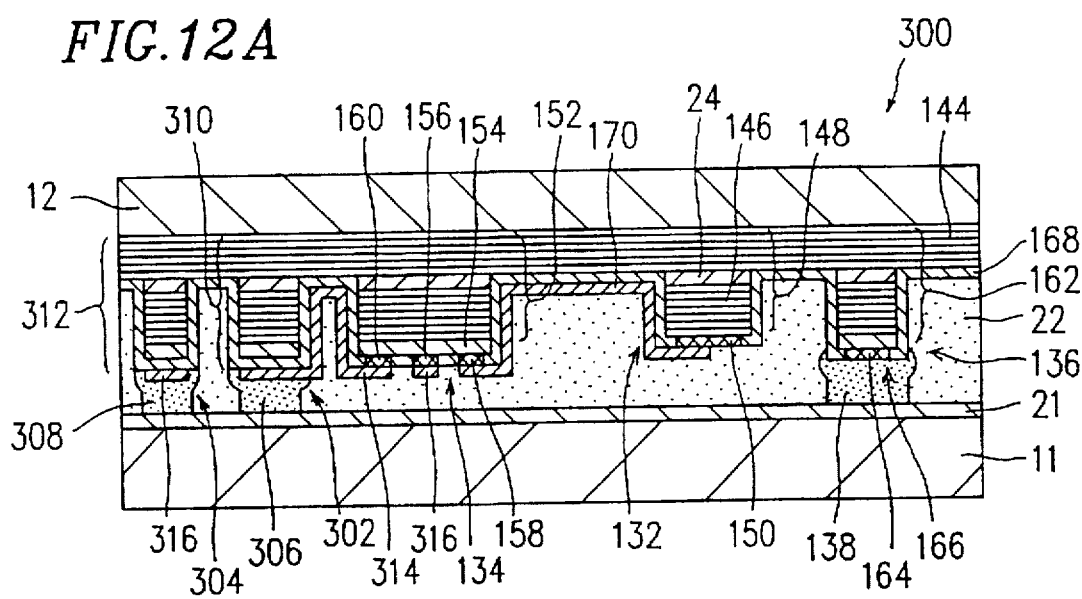
FIGS. 12A and 12B are cross-sectional views showing a configuration of an optical module according to a fourth example of the present invention.

FIG. 12A is a cross-sectional view of an optical module 300 according to a fourth example of the present invention. The optical module 300 is different from the optical module 130 shown in FIG. 9 in that the optical module 300 includes two supporting structures and that the micro bumps are not directly in contact with the field-effect transistor. In FIG. 12A, the same components as those of the optical module 130 shown in FIG. 9 will be denoted by the same reference numerals.

The optical module 300 includes: a first substrate 12; a vertical-cavity surface-emitting laser 132, an electrode structure 136, a field-effect transistor 134, a first supporting structure 302 and a second supporting structure 304 which are supported by the first substrate 12; and a second substrate 11. The surface of the second substrate 11 is covered with an insulating film 21 made of silicon nitride, silicon oxide or the like, and micro bumps 138, 306 and 308 are provided on the second substrate 11 via the insulating film 21. Though not shown in FIG. 12A, the micro bumps 138, 306 and 308 are connected with lines including pads.

The vertical-cavity surface-emitting laser 132 includes: a light-emitting layer 24; a semiconductor multi-layered structure 148 including a part of an n-type distributed Bragg reflector 144 and a p-type distributed Bragg reflector 146 which are provided so as to interpose the light-emitting layer 24 therebetween; and an electrode 150 provided on the semiconductor multi-layered structure 148. The n-type distributed Bragg reflector 144 is formed so as to cover the entire surface of the first substrate 12.

The FET 134 includes: an n-type channel layer 154; and a gate electrode 156, a source electrode 158 and a drain electrode 160 provided on the n-type channel layer 154. The channel layer 154 is formed on the semiconductor multi-layered structure 152 consisting of the same semiconductor layers as those of the semiconductor multi-layered structure 148.

The electrode structure 136 includes: a semiconductor multi-layered structure 162 consisting of the same semiconductor layers as those of the semiconductor multi-layered structure 148 and the channel layer 154; and an electrode 164 provided on the semiconductor multi-layered structure 162. The semiconductor multi-layered structure 162 includes a part of the n-type distributed Bragg reflector 144 and the p-n junction formed in the semiconductor multilayered structure 162 has been broken. As a result, the upper surface 166 of the electrode structure 136 is connected with the n-type distributed Bragg reflector 144 of the vertical-cavity surface-emitting laser 132 at a low resistance.

The first supporting structure 302 and the second supporting structure 304 include: semiconductor multi-layered structures 310 and 312 consisting of the same semiconductor layers as those of the semiconductor multi-layered structure 148 and the channel layer 154; a part of the insulating layer 168 covering the semiconductor multi-layered structures 310 and 312; and parts of the lines 314 and 316 provided on the insulating layer 168. The lines 314 and 316 are electrically connected with the drain electrode 160 and the gate electrode 156, respectively.

The sides of the vertical-cavity surface-emitting laser 132, the FET 134, the electrode structure 136, the first supporting structure 302 and the second supporting structure 304 and the surface of the n-type distributed Bragg reflector 144 are covered with an insulating film 168 made of silicon oxide, silicon nitride or the like. A line 170 for electrically connecting the electrode 150 of the vertical-cavity surface-emitting laser 132 with the source electrode 158 is provided on the insulating film 168.

The upper surfaces of the electrode structure 136, the first supporting structure 302, and the second supporting structure 304 jut out from the first substrate 12. The first substrate 12 and the second substrate 11 are positioned so that the micro bumps 138, 306 and 308 are in contact with the upper surface 166 of the electrode structure 136, the upper surface of the first supporting structure 302, and the upper surface of the second supporting structure 304, respectively. The gap between the first substrate 12 and the second substrate 11 is filled with a UV curable resin 22.

In the optical module 300, a voltage is applied from the micro bump 306 to the p-type distributed Bragg reflector 146 of the vertical-cavity surface-emitting laser 132 via the line 314, the drain electrode 160, the source electrode 158 and the line 170 based on the voltage applied from the micro bump 308 to the line 316 and the gate electrode 156. On the other hand, a voltage is also applied to the n-type distributed Bragg reflector 144 via the electrode structure 136, so that the vertical-cavity surface-emitting laser 132 can emit light.

In this configuration, since the upper surface of the vertical-cavity surface-emitting laser 132 does not come into contact with the micro bumps, it is possible to bond the second substrate 11 with the first substrate 12 without applying a load to the light-emitting layer 24 or the FET 134.

Figure 12B:
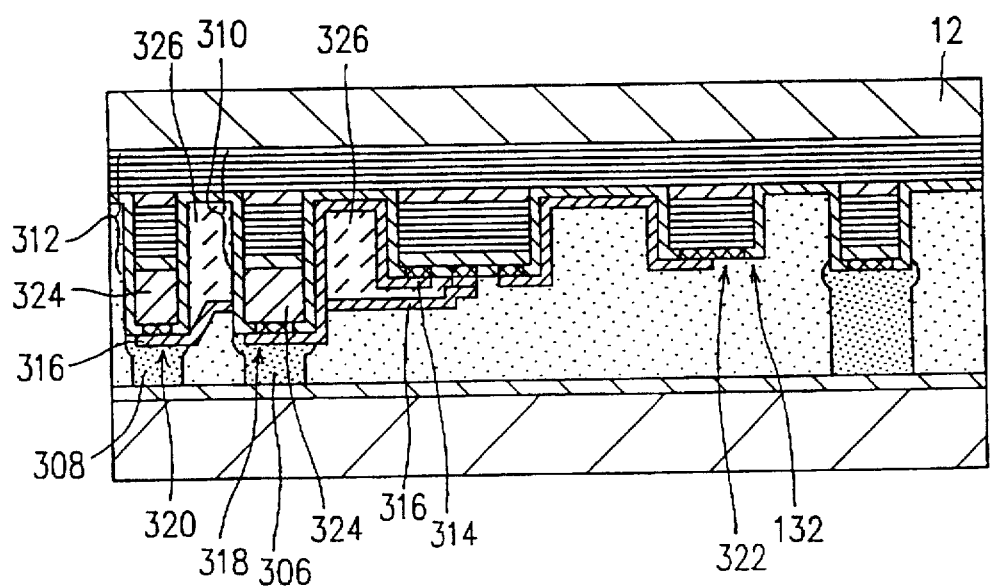

In addition, in order to unfailingly not apply a load to the vertical-cavity surface-emitting laser 132, the upper surfaces 318 and 320 of the first and the second supporting structures 302 and 304 are preferably higher than the upper surface 322 of the vertical-cavity surface-emitting laser 132, as shown in FIG. 12B. Such a configuration can be realized by providing an insulating layer 324 made of silicon oxide, silicon nitride or the like with an appropriate thickness between the semiconductor multi-layered structure 310 and the insulating layer 168 and between the semiconductor multi-layered structure 312 and the insulating layer 168. The difference in the height between the upper surfaces 318 and 322 and between the upper surfaces 320 and 322 is preferably 0.5 μm or more. In such a case, in order to prevent the disconnection of the lines 314 and 316 formed at much different heights, it is preferable to provide a polyimide resin 326 on the insulating layer 168 and reduce the difference in the heights. In this configuration, even when the first and the second supporting structures 302 and 304 are engaged into the micro bumps 306 and 308, it is possible to unfailingly prevent the contact between the upper surface 322 of the vertical-cavity surface-emitting laser 132 and the second substrate 11 and the application of a load to the light-emitting layer 24.

In the above-described example, the optical module includes a field-effect transistor. Alternatively, the optical module can include a heterojunction bipolar transistor instead of the field-effect transistor as will be described below.

Figure 13A:
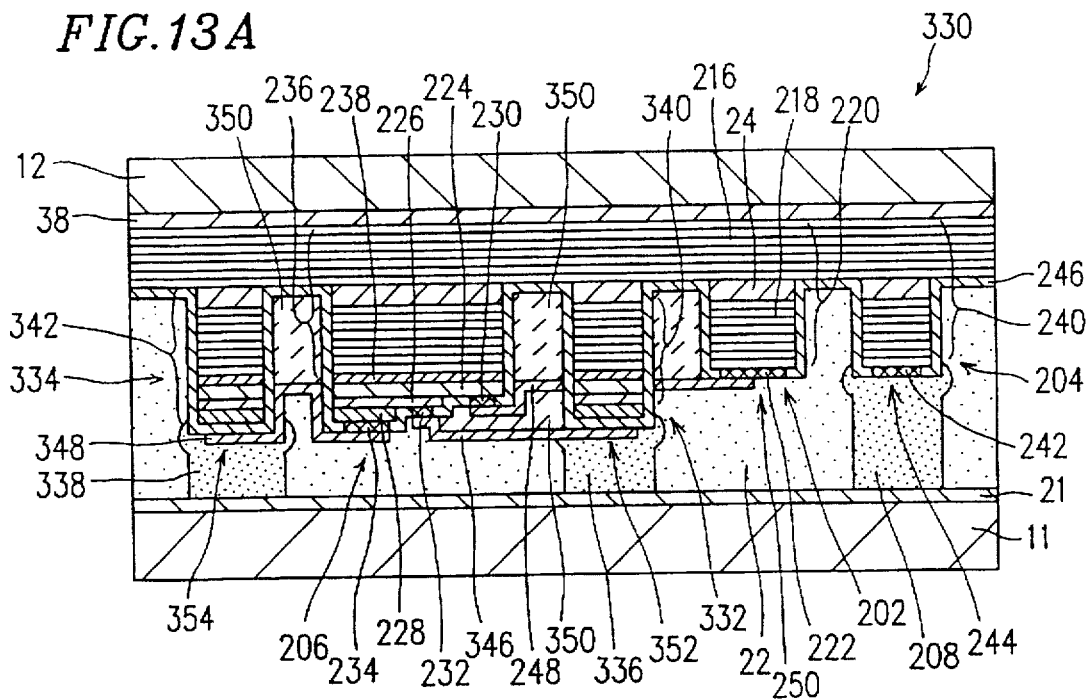
FIGS. 13A and 13B are cross-sectional views showing a configuration of another optical module according to the fourth example of the present invention.

FIG. 13A is a cross-sectional view of an optical module 330. The optical module 330 is different from the optical module 200 shown in FIG. 10 in that the optical module 330 includes two supporting structures and that the micro bumps are not in contact with the heterojunction bipolar transistor. In FIG. 13A, the same components as those of the optical module 200 shown in FIG. 10 will be denoted by the same reference numerals.

The optical module 330 includes: a first substrate 12; a vertical-cavity surface-emitting laser 202, an electrode structure 204, a first supporting structure 332, a second supporting structure 334, and a heterojunction bipolar transistor 206 which are supported by the first substrate 12 via a buffer layer 38; and a second substrate 11.

The surface of the second substrate 11 is covered with an insulating film 21 made of silicon nitride, silicon oxide or the like, and micro bumps 208, 336 and 338 are provided on the second substrate 11 via the insulating film 21. Though not shown in FIG. 13A, the micro bumps 208, 336 and 338 are connected with lines including pads.

The vertical-cavity surface-emitting laser 202 includes: a light-emitting layer 24; a semiconductor multi-layered structure 220 including a part of a p-type distributed Bragg reflector 216 and an n-type distributed Bragg reflector 218 which are provided so as to interpose the light-emitting layer 24 therebetween; and an electrode 222 provided on the semiconductor multi-layered structure 220. The p-type distributed Bragg reflector 216 is formed so as to cover the entire surface of the buffer layer 38.

The heterojunction bipolar transistor 206 includes: a collector layer 224; a base layer 226; an emitter layer 228; and a collector electrode 230, a base electrode 232 and an emitter electrode 234 electrically connected with these semiconductor layers 224, 226 and 228, respectively. The base layer 226 is interposed between the emitter layer 228 and the collector layer 224. The collector layer 224 is formed on the semiconductor multi-layered structure 236 consisting of the same semiconductor layers as those of the semiconductor multi-layered structure 220 via the buffer layer 238.

The electrode structure 204 includes: a semiconductor multi-layered structure 240 consisting of the same semiconductor layers as those of the semiconductor multi-layered structure 220; and an electrode 242 provided on the semiconductor multi-layered structure 240. The semiconductor multi-layered structure 240 includes a part of the p-type distributed Bragg reflector 216 and the p-n junction formed in the semiconductor multi-layered structure 240 has been broken. As a result, the upper surface 244 of the electrode structure 204 is connected with the p-type distributed Bragg reflector 216 of the vertical-cavity surface-emitting laser 202 at a low resistance.

The first supporting structure 332 and the second supporting structure 334 include: semiconductor multi-layered structures 340 and 342 consisting of the same semiconductor layers as those of the semiconductor multi-layered structure 236, the buffer layer 238, the collector layer 224, the base layer 226, and the emitter layer 228; a part of the insulating layer 246 covering the semiconductor multi-layered structures 340 and 342; and parts of the lines 346 and 348 provided on the insulating layer 246. The lines 346 and 348 are electrically connected with the base electrode 232 and the emitter electrode 234, respectively.

The sides of the vertical-cavity surface-emitting laser 202, the heterojunction bipolar transistor 206, the first supporting structure 332, the second supporting structure 334, and the electrode structure 204 and the surface of the p-type distributed Bragg reflector 216 are covered with an insulating layer 246 made of silicon oxide, silicon nitride or the like. A line 248 for electrically connecting the electrode 222 of the vertical-cavity surface-emitting laser 202 with the collector electrode 230 is provided on the insulating film 246. The lines 248, 346 and 348 are supported by the polyimide film 350 provided on the insulating layer 246.

The upper surface 244 of the electrode structure 204, the upper surface 352 of the first supporting structure 332, and the upper surface 354 of the second supporting structure 334 jut out from the first substrate 12. The first substrate 12 and the second substrate 11 are positioned so that the micro bumps 208, 336, and 338 are in contact with the upper surface 244 of the electrode structure 204, the upper surface 352 of the first supporting structure 332, and the upper surface 354 of the second supporting structure 334, respectively. The gap between the first substrate 12 and the second substrate 11 is filled with a UV curable resin 22.

In the optical module 330, a voltage is applied from the micro bump 338 to the n-type distributed Bragg reflector 218 of the vertical-cavity surface-emitting laser 202 via the line 348, the emitter electrode 234, the collector electrode 230 and the line 248 based on the voltage applied from the micro bump 336 to the base electrode 232 via the line 346. On the other hand, a voltage is also applied to the p-type distributed Bragg reflector 216 via the electrode structure 204, so that the vertical-cavity surface-emitting laser 202 can emit light.

In this configuration, since the upper surface of the vertical-cavity surface-emitting laser 202 does not come into contact with the micro bumps, it is possible to bond the second substrate 11 with the first substrate 12 without applying a load to the light-emitting layer 24 and the heterojunction bipolar transistor 206.

Figure 13B:
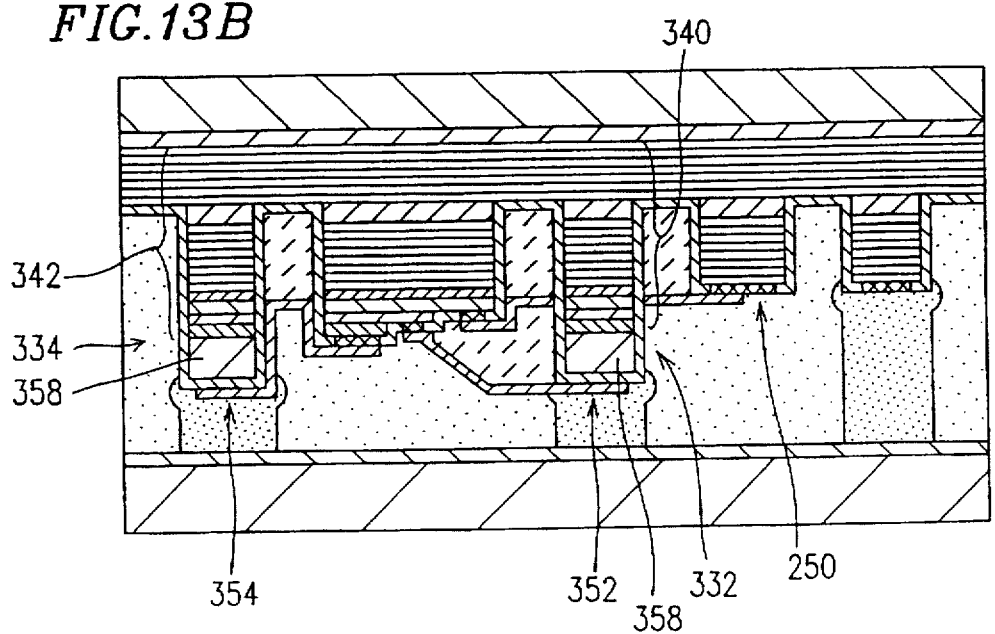

In addition, in order to unfailingly not apply a load to the vertical-cavity surface-emitting laser 202, the upper surfaces 352 and 354 of the first and the second supporting structures 332 and 334 are preferably higher than the upper surface 250 of the vertical-cavity surface-emitting laser 202 with respect to the first substrate 12, as shown in FIG. 13B. Such a configuration can be realized by providing an insulating layer 358 made of silicon oxide, silicon nitride or the like with an appropriate thickness between the semiconductor multi-layered structure 340 and the insulating layer 246 and between the semiconductor multi-layered structure 342 and the insulating layer 246. The difference in the height between the upper surfaces 352 and 250 and between the upper surfaces 354 and 250 is preferably 0.5 μm or more. In such a configuration, even when the first and the second supporting structures 332 and 334 are engaged into the micro bumps 336 and 338, it is possible to unfailingly prevent the contact between the upper surface 250 of the vertical-cavity surface-emitting laser 202 and the second substrate 11 and the application of a load to the light-emitting layer 24.

On the other hand, as will be described below, a heterojunction bipolar transistor can be formed on the vertical-cavity surface-emitting laser.

Figure 14A:
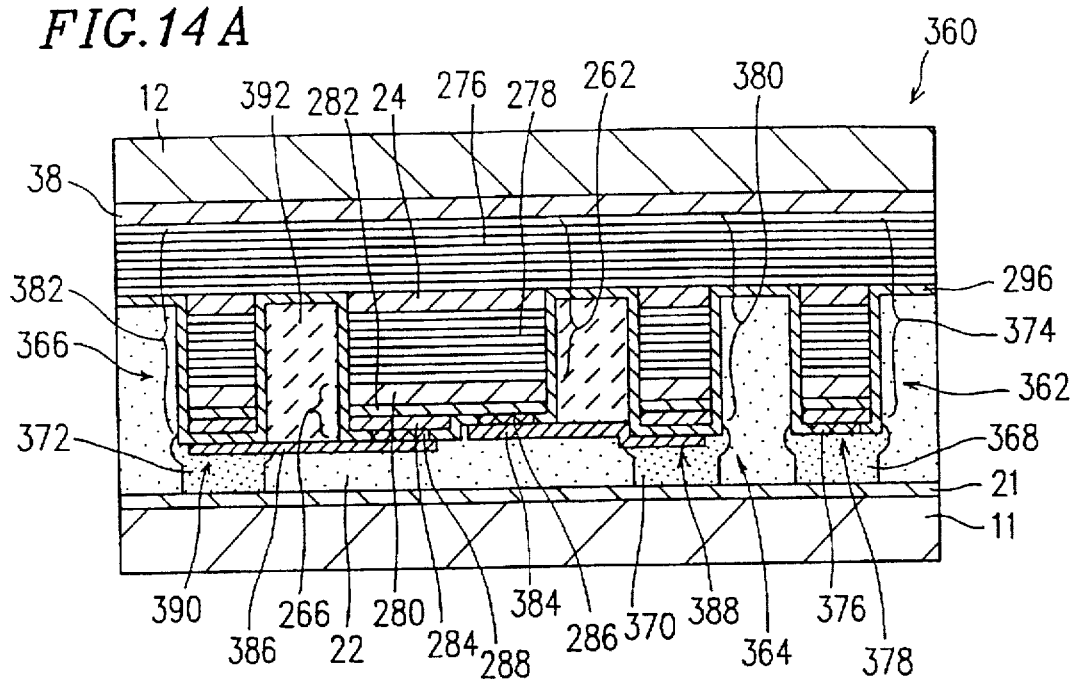
FIGS. 14A and 14B are cross-sectional views showing a configuration of still another optical module according to the fourth example of the present invention.

FIG. 14A is a cross-sectional view of an optical module 360. The optical module 360 is different from the optical module 260 shown in FIG. 11 in that the optical module 360 includes two supporting structures and that the micro bumps are not in contact with the heterojunction bipolar transistor. In FIG. 14A, the same components as those of the optical module 260 shown in FIG. 11 will be denoted by the same reference numerals.

The optical module 360 includes: a first substrate 12; a vertical-cavity surface-emitting laser 262, an electrode structure 362, a first supporting structure 364, and a second supporting structure 366 which are supported by the first substrate 12 via the buffer layer 38; a heterojunction bipolar transistor 266 formed on the vertical-cavity surface-emitting laser 262; and a second substrate 11. The surface of the second substrate 11 is covered with an insulating film 21 made of silicon nitride, silicon oxide or the like, and micro bumps 368, 370 and 372 are provided on the second substrate 11 via the insulating film 21. Though not shown in FIG. 14A, the micro bumps 368, 370 and 372 are connected with lines including pads.

The vertical-cavity surface-emitting laser 262 includes: a light-emitting layer 24; and a part of a p-type distributed Bragg reflector 276 and an n-type distributed Bragg reflector 278 which are provided so as to interpose the light-emitting layer 24 therebetween. The p-type distributed Bragg reflector 276 is formed so as to cover the entire surface of the buffer layer 38.

The heterojunction bipolar transistor 266 includes: a collector layer 280; a base layer 282; an emitter layer 284; and a base electrode 286 and an emitter electrode 288 electrically connected with the base layer 282 and the emitter layer 284, respectively. The base layer 282 is interposed between the emitter layer 284 and the collector layer 280. The collector layer 228 is formed on the n-type distributed Bragg reflector 278 of the vertical-cavity surface-emitting laser 262.

The electrode structure 362 includes: a semiconductor multi-layered structure 374 consisting of the same semiconductor layers as those of the vertical-cavity surface-emitting laser 262 and the collector layer 280, the base layer 282, and the emitter layer 284; and an electrode 376 provided on the semiconductor multi-layered structure 374. The semiconductor multi-layered structure 374 includes a part of the p-type distributed Bragg reflector 276 and the p-n junction formed in the semiconductor multi-layered structure 374 has been broken. As a result, the upper surface 378 of the electrode structure 362 is connected with the p-type distributed Bragg reflector 276 of the vertical-cavity surface-emitting laser 262 at a low resistance.

The first supporting structure 364 and the second supporting structure 366 include: semiconductor multi-layered structures 380 and 382 consisting of the same semiconductor layers as those of the semiconductor multi-layered structure 374; a part of the insulating layer 296 covering the semiconductor multi-layered structures 380 and 382; and parts of the lines 384 and 386 provided on the insulating layer 296. The lines 384 and 386 are supported by the polyimide film 392 formed on the insulating layer 296, and electrically connected with the base electrode 286 and the emitter electrode 288, respectively.

The sides of the vertical-cavity surface-emitting laser 262, the heterojunction bipolar transistor 266, the first supporting structure 364, the second supporting structure 366, and the electrode structure 362 and the surface of the p-type distributed Bragg reflector 276 are covered with an insulating layer 296 made of silicon oxide, silicon nitride or the like.

The upper surface 378 of the electrode structure 362, the upper surface 388 of the first supporting structure 364, and the upper surface 390 of the second supporting structure 366 jut out from the first substrate 12. The first substrate 12 and the second substrate 11 are positioned so that the micro bumps 368, 370, and 372 are in contact with the upper surface 378 of the electrode structure 362, the upper surface 388 of the first supporting structure 364, and the upper surface 390 of the second supporting structure 366, respectively. The gap between the first substrate 12 and the second substrate 11 is filled with a UV curable resin 22.

In the optical module 360, negative charges are applied from the micro bump 372 to the n-type distributed Bragg reflector 278 via the line 386, the emitter layer 284, the base layer 282, and the collector layer 280 based on the voltage applied from the micro bump 370 to the base layer 282 via the line 384 and the base electrode 286. On the other hand, a positive voltage is applied from the micro bump 368 to the p-type distributed Bragg reflector 276 via the electrode structure 362, so that the vertical-cavity surface-emitting laser 262 can emit light.

In this configuration, since the heterojunction bipolar transistor 266 formed on the vertical-cavity surface-emitting laser 262 does not come into contact with the micro bumps, it is possible to bond the second substrate 11 with the first substrate 12 without applying a load to the light-emitting layer 24.

Figure 14B:
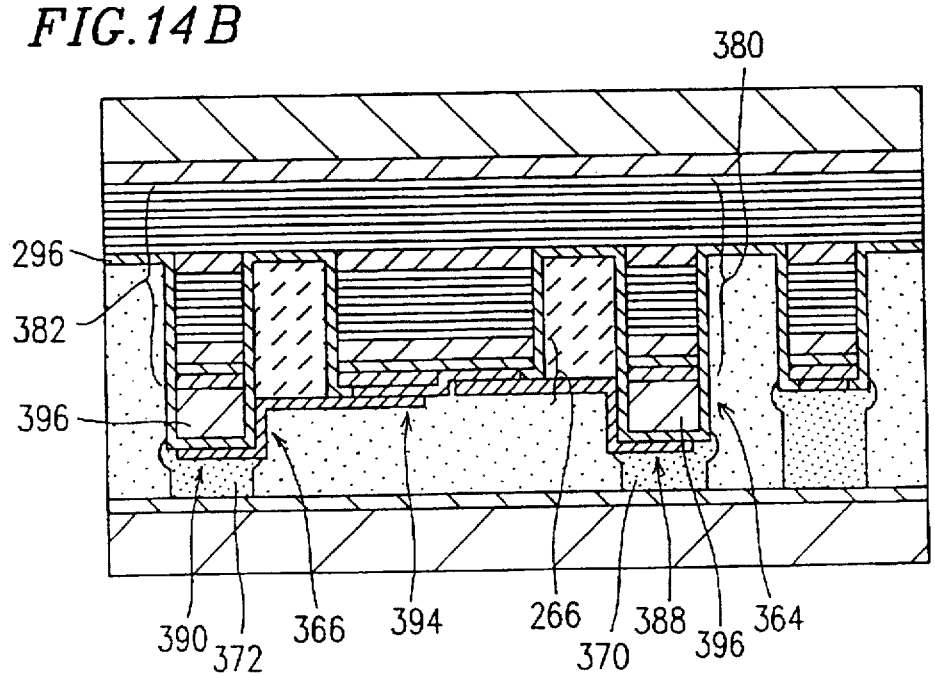

In addition, in order unfailingly not apply a load to the vertical-cavity surface-emitting laser 262, the upper surfaces 388 and 390 of the first and the second supporting structures 364 and 366 are preferably higher than the upper surface 394 of the heterojunction bipolar transistor 266 with respect to the first substrate 12, as shown in FIG. 14B. Such a configuration can be realized by providing an insulating layer 396 made of silicon oxide, silicon nitride or the like with an appropriate thickness between the semiconductor multi-layered structure 380 and the insulating layer 296 and between the semiconductor multi-layered structure 382 and the insulating layer 296. The difference in the height between the upper surfaces 388 and 394 and between the upper surfaces 390 and 394 is preferably 0.5 μm or more. In such a configuration, even when the first and the second supporting structures 364 and 366 are engaged into the micro bumps 370 and 372, it is possible to unfailingly prevent the contact between the upper surface 394 of the heterojunction bipolar transistor 266 and the second substrate 11 and the application of a load to the light-emitting layer 24.

Hereinafter, as an exemplary method for producing the optical modules described in this example, a method for producing the optical module 360 will be described.

Figure 15:
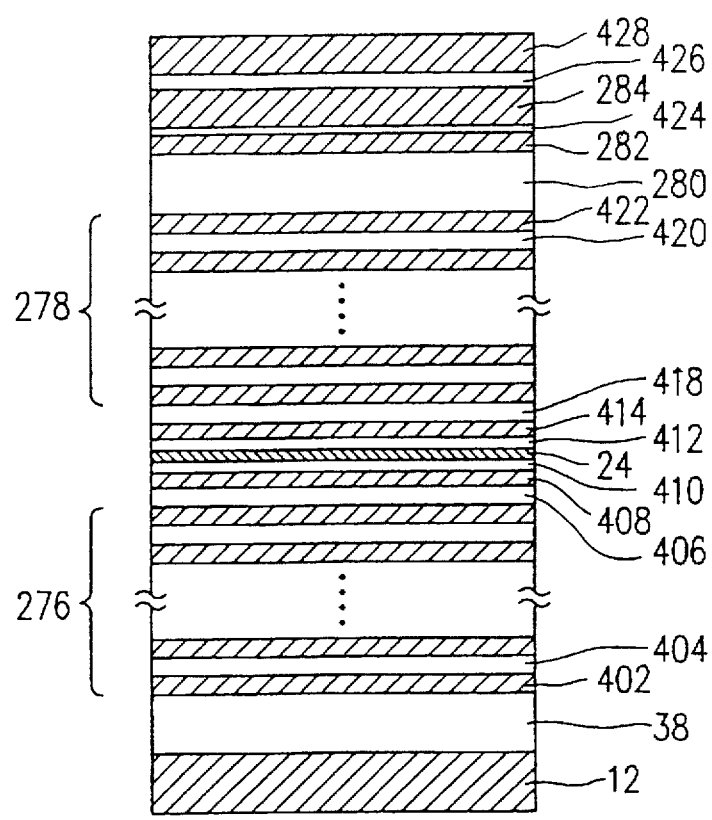
FIG. 15 is a cross-sectional view showing a configuration of the vertical-cavity surface-emitting laser used for the optical module shown in FIGS. 14A and 14B.

First, as shown in FIG. 15, the buffer layer 38, a plurality of semiconductor layers constituting the vertical-cavity surface-emitting laser 262 (FIG. 14A), and a plurality of semiconductor layers constituting the heterojunction bipolar transistor 266 (FIG. 14A) are epitaxially grown on the first substrate 12 made of n$^+$-type GaAs by an MBE method or the like.

More specifically, the p-type distributed Bragg reflector 276 is formed of 24.5 pairs of alternately stacked lasers consisting of p-type AlAs layers 402 and p-type GaAs layers 404. In the same way, the n-type distributed Bragg reflector 278 is formed of 24.5 pairs of alternately stacked lasers consisting of n-type AlAs layers 422 and n-type GaAs layers 420.

In addition, in order to form a quantum well layer, barrier layers 410 and 412 are provided so as to interpose the light-emitting layer 24. In order to adjust the length of a laser resonator, spacer layers 406, 408, 414 and 418 are provided. Furthermore, a GaAs layer 424 is provided between the base layer 282 and the emitter layer 284, and a graded layer 426 and a cap layer 428 are provided on the emitter layer 284. The thicknesses of the respective semiconductor layers and the concentration of the impurity thereof are shown in the following Table 2.

TABLE 2

| Layer | Composition | Thickness (nm) | Impurity concentration (cm$^{-3}$) |
|---|---|---|---|
| cap layer 428 | n-GaAs | 190 | Si: 1 × 10$^{18}$ |
| graded layer 426 | n-AlGaAs | 30 | Si: 1 × 10$^{18}$ |
| emitter layer 284 | n-Al$_{0.3}$Ga$_{0.7}$As | 150 | Si: 1 × 10$^{18}$ |
| GaAs layer 424 | u-GaAs | 10 | |
| base layer 282 | p-GaAs | 100 | Be: 5 × 10$^{18}$ |
| collector layer 280 | n-GaAs | 500 | Si: 1 × 10$^{18}$ |
| n-type AlAs layer 422 | n-GaAs | 82.8 | Si: 1 × 10$^{18}$ |
| n-type GaAs layer 420 | n-AlAs | 69.6 | Si: 1 × 10$^{18}$ |
| spacer layer 418 | n-Al$_{0.5}$Ga$_{0.5}$As | 86 | Si: 1.5 × 10$^{18}$ |
| spacer layer 414 | u-Al$_{0.5}$Ga$_{0.5}$As | 50 | |
| barrier layer 412 | u-GaAs | 10 | |
| light-emitting layer 24 | u-In$_{0.2}$Ga$_{0.8}$As | 8 | |
| barrier layer 410 | u-GaAs | 10 | |
| spacer layer 408 | u-Al$_{0.5}$Ga$_{0.5}$As | 50 | |
| spacer layer 406 | p-Al$_{0.5}$Ga$_{0.5}$As | 86 | Be: 1.5 × 10$^{18}$ |
| p-type GaAs layer 404 | p-GaAs | 69.6 | Be: 1 × 10$^{18}$ |
| p-type AlAs layer 402 | p-AlAs | 82.8 | Be: 1 × 10$^{18}$ |
| buffer layer 38 | p$^+$-GaAs | 100 | Be: 5 × 10$^{18}$ |

Figure 16A:
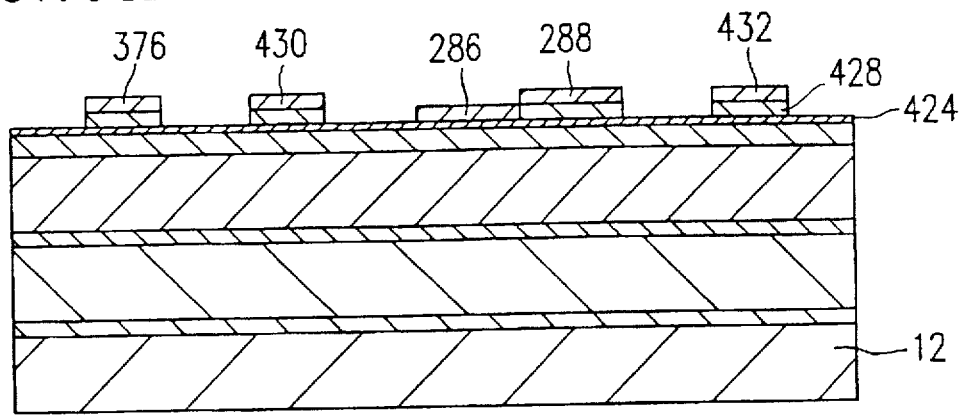
FIGS. 16A to 16C are cross-sectional views illustrating a method for producing the optical module shown in FIG. 15.

Next, as shown in FIG. 16A, a metallic film made of AuGe/Ni is formed on the cap layer 428, i.e., the uppermost layer of the semiconductor multi-layered structure formed on the first substrate 12 shown in FIG. 15. The metallic film is then patterned so as to form the electrode 376 for the electrode structure 362 and the emitter electrode 288. Electrodes 430 and 432 are formed as a mask for forming the first and the second supporting structures 364 and 366. Thereafter, by using these electrodes 288, 376, 430 and 432 as a mask, the cap layer 428, the graded layer 426 and the emitter layer 284 are etched by using a mixed solution of a sulfuric acid solution and a hydrogen peroxide solution until the base layer 282 is exposed.

Subsequently, a base electrode 286 made of Cr/Pt/Au is formed. Then, a heat treatment is performed so as to form an ohmic contact between these electrodes and the semiconductor layers.

Figure 16B:
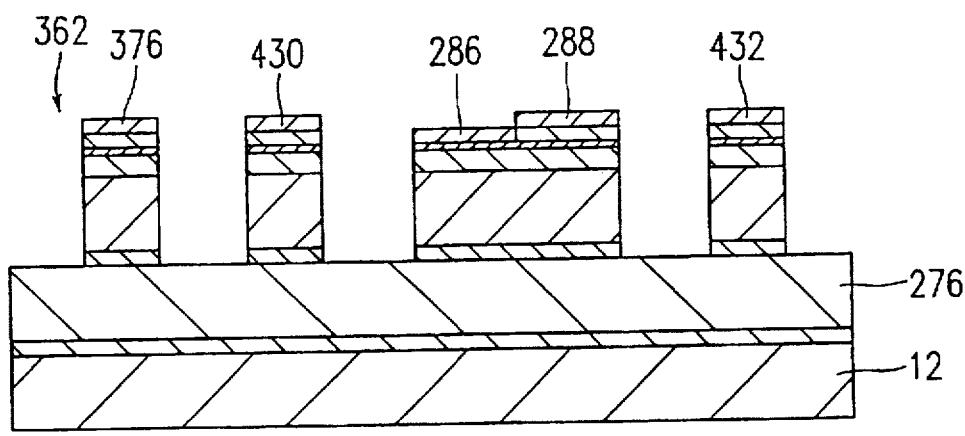

Next, as shown in FIG. 16B, by using these electrodes 286, 288, 376, 430 and 432 as a mask, the stacked semiconductor layers are etched by a dry etching method using a chlorine gas until at least the semiconductor layers forming the p-type distributed Bragg reflector 276 are exposed. Thereafter, a voltage is applied between the electrode 376 and the surface of the p-type distributed Bragg reflector 276, thereby breaking the p-n junction formed in the semiconductor layers in the electrode structure 362.

Figure 16C:
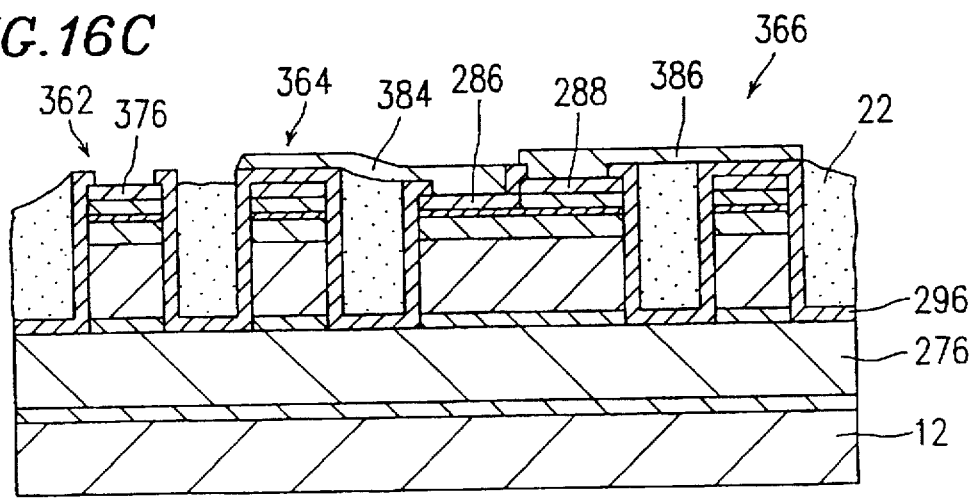

Then, as shown in FIG. 16C, an insulating layer 296 is formed so as to cover the entire surface of the first substrate 12, and a polyimide film 22 is further formed. Thereafter, contact holes are formed so as to partially expose the electrodes 376, 286 and 288. The line 384 to be electrically connected with the base electrode 286 and reach the upper portion of the first supporting structure 364, and the line 386 to be electrically connected with the emitter electrode 288 and reach the upper portion of the second supporting structure 366 are formed.

Then, the first substrate 12 is bonded with the second substrate 11 in the same way as in the first example. As a result, the optical module 360 shown in FIGS. 14A and 14B is completed.

EXAMPLE 5

Figure 17:
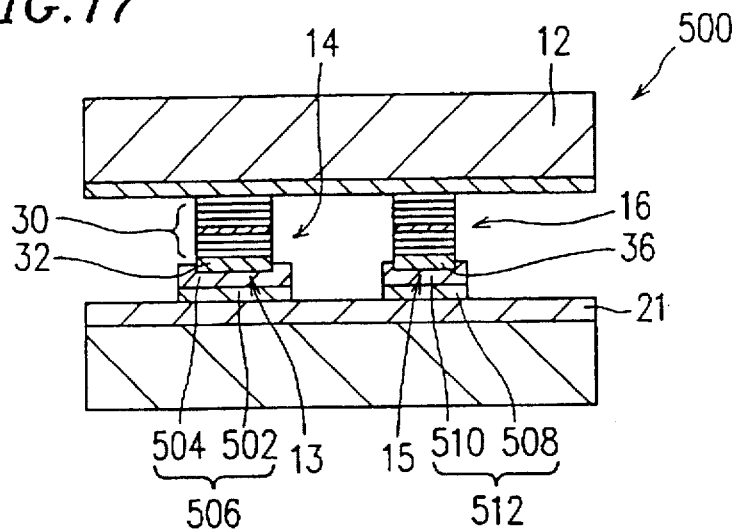
FIG. 17 is a cross-sectional view showing a configuration of an optical module according to a fifth example of the present invention.

FIG. 17 is a cross-sectional view of an optical module 500 according to a fifth example of the present invention. The optical module 500 is different from the optical module 10 of the first example in that the optical module 500 includes micro bumps made of a metal with a low melting point and that the first and the second substrates are bonded by making an alloy between the micro bump and a metal for receiving the micro bump. In FIG. 17, the same components as those of the optical module 10 shown in FIG. 1 will be denoted by the same reference numerals.

In the optical module 500, the micro bump 506 consists of an Au layer 502 formed on an insulating layer 21 and a bismuth layer 504 formed on the Au layer 502. In the same way, the micro bump 512 also consists of an Au layer 508 and a bismuth layer 510. In the interface between the bismuth layer 504 and the electrode 32 and in the interface between the bismuth layer 510 and the electrode 36, an alloy layer made from bismuth and the metal forming the electrodes 32 and an alloy layer made from bismuth and the metal forming the electrodes 36 are formed, respectively.

After the structures on the first substrate 12 are formed, the micro bumps 506 and 512 are made to come into contact with the electrodes 32 and 36, respectively. Then, a heat treatment is performed so that the temperature of the contact portions becomes 350° C. or more. By performing the heat treatment, bismuth is melted and the alloys are formed in the contact portions from bismuth and the metal forming the electrodes 32 and 36, so that the micro bumps 506 and 512 are bonded with the electrodes 32 and 36, respectively. As a result, the first substrate 12 is bonded with the second substrate 11.

In such a configuration, since the two substrates are bonded by forming alloys therebetween, no load is required to be applied to realize the bonding. Accordingly, substantially no load is applied to the light-emitting layer 24 and the emission efficiency of the vertical-cavity surface-emitting laser 14 is hardly degraded.

As is apparent from the foregoing description, it is not necessary to employ a thermosetting resin used in the first example in order to bond the first and the second substrate 12 and 11. However, the gap between the first and the second substrate 12 and 11 can be filled with an appropriate resin allowing for maintaining a stable bonding state between the first and the second substrate 12 and 11.

A micro bump including bismuth is applicable to the optical modules having various configurations described in the first to fourth examples.

Figure 18:
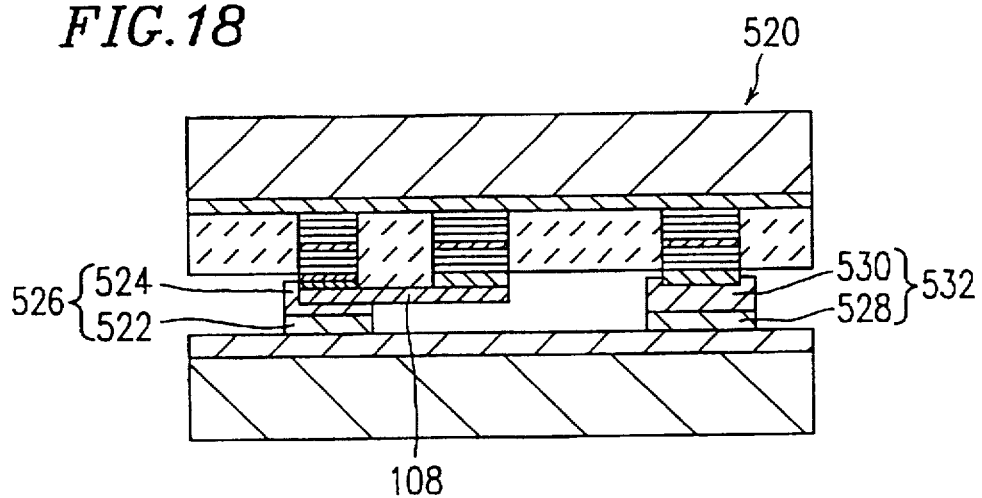
FIG. 18 is a cross-sectional view showing a configuration of another optical module according to the fifth example of the present invention.

FIG. 18 shows an exemplary configuration of the optical module including a supporting structure to which such a micro bump is applied. The optical module 520 shown in FIG. 18 is different from the optical module 100 shown in FIG. 6 in that the optical module 520 includes a micro bump 526 consisting of an Au layer 522 and bismuth layer 524 and a micro bump 532 consisting of an Au layer 528 and bismuth layer 530 on the second substrate 11. In such a configuration, the micro bump 526 is in contact with the metal forming a line 108, and an alloy layer is formed in the interface therebetween.

Figure 19:
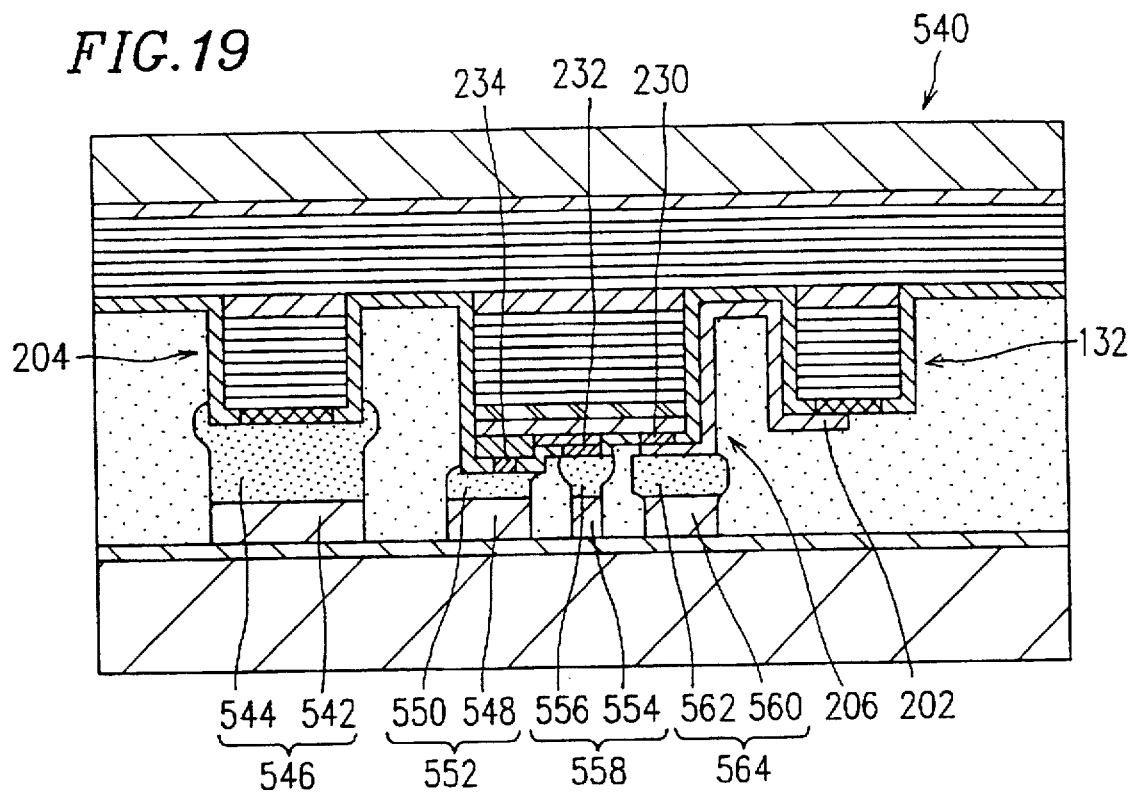
FIG. 19 is a cross-sectional view showing a configuration of still another optical module according to the fifth example of the present invention.

FIG. 19 shows an exemplary configuration of the optical module including a heterojunction bipolar transistor to which such a micro bump is applied. The optical module 540 shown in FIG. 19 is different from the optical module 200 shown in FIG. 10 in that the optical module 540 includes micro bumps 546, 552, 558 and 564 consisting of Au layers 542, 548, 554 and 560 and bismuth layers 544, 550, 556 and 562 on the second substrate 11, respectively. In such a configuration, the micro bumps 546, 552, 558 and 564 are in contact with the metals forming the emitter electrode 234, the base electrode 232 and the collector electrode 230, respectively, and an alloy layer is formed in each of the interfaces between these micro bumps and electrodes.

Figure 20:
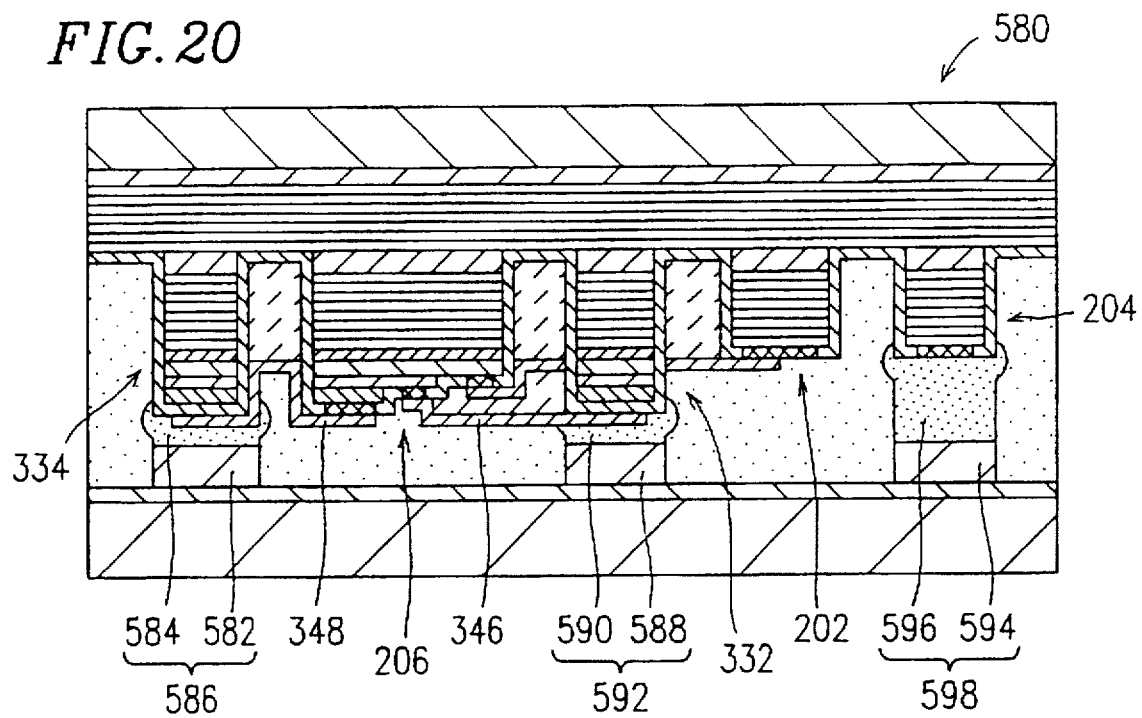
FIG. 20 is a cross-sectional view showing a configuration of still another optical module according to the fifth example of the present invention.
Figure 21:
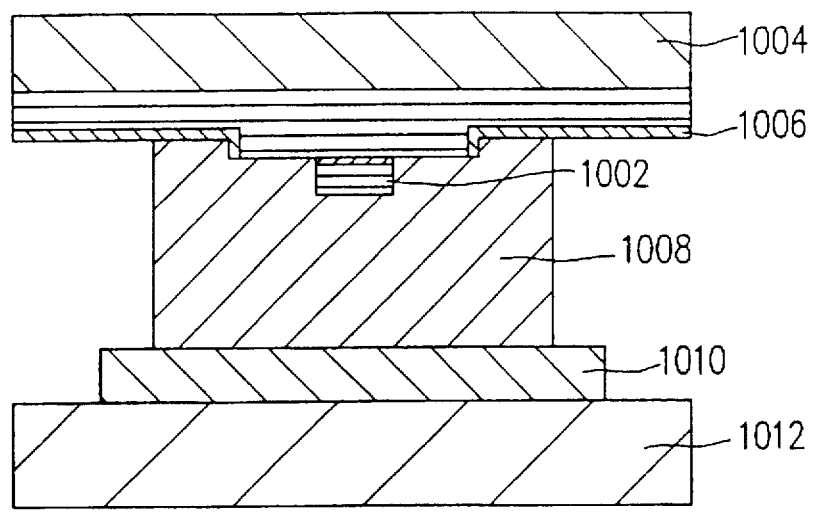
FIG. 21 is a cross-sectional view showing a configuration of a vertical-cavity surface-emitting laser obtaining by mounting a pair of substrates by a conventional method.

FIG. 20 shows an exemplary configuration of the optical module including a supporting structure and a heterojunction bipolar transistor to which such a micro bump is applied. The optical module 580 shown in FIG. 20 is different from the optical module 330 shown in FIG. 13A in that the optical module 580 includes micro bumps 586, 592 and 598 consisting of Au layers 582, 588, 594 and bismuth layers 584, 590 and 596 on the second substrate 11, respectively. In such a configuration, the micro bumps 586 and 592 are in contact with the metals forming the lines 348 and 346, respectively and an alloy layer is formed in each of the interfaces therebetween.

Although, an optical module which has micro bumps including a bismuth layer is explained with reference to FIGS. 17 to 20, it is also possible to provide an optical module with an electrode structure, a supporting structure, or a vertical-cavity surface-emitting laser whose upper surface is made of bismuth while micro bumps are composed of material other than bismuth.

Preferred embodiments of the present invention have been described in the first to fifth examples. It is noted that an exemplary configuration described in one example can be appropriately combined with another configuration described in any other example.

For example, the electrode structure shown in FIGS. 4A and 4B is applicable to any of the optical module of the second to fifth examples. The optical modules of the second to fifth examples include only one vertical-cavity surface-emitting laser. Alternatively, each of the optical modules may include a plurality of vertical-cavity surface-emitting lasers arranged in an array as shown in FIGS. 5A and 5B. The interconnection of the optical module and an optical fiber was described with reference to FIG. 8. The configuration of an optical module of any of the first, third, fourth and fifth examples can be modified into the configuration shown in FIG. 8.

In all the first to fifth examples, the first substrate 12 can be a semiconductor substrate made of a material other than n-type GaAs. That is to say, a substrate suitable for forming the semiconductor multi-layered structure 30 constituting the vertical-cavity surface-emitting laser 14 can be used. For example, in the case of forming a vertical-cavity surface-emitting laser including an InP based active layer, an InP substrate can be used.

As is obvious to those skilled in the art, a vertical-cavity surface-emitting laser can include a light-emitting layer made of a semiconductor other than InGaAs. Either the n-type distributed Bragg reflector or the p-type distributed Bragg reflector can be provided close to the first substrate. However, if the p-type distributed Bragg reflector is provided so as to be close to the first substrate and cover the entire surface of the first substrate, then the resistance of the p-type distributed Bragg reflector can be reduced.

Various substrates such as a conductive substrate or an insulating substrate can be used as the second substrate 11. However, the second substrate is preferably made of a material having a satisfactory thermal conductivity. In the case of using a conductive substrate, an insulating film is preferably formed on the surface on which a micro bump is formed. An AlN substrate, a substrate which is made of glass, silicon or Al₂O₃ and has a diamond film thereon or the like can be used as the second substrate.

According to the present invention, it is possible to provide an optical module realizing an excellent emission efficiency in which a substrate including a vertical-cavity optical module thereon can be mounted on a submount substrate without applying an excessive load causing the degradation of the emission efficiency to the light-emitting layer.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An optical module comprising:
   a first substrate;
   a vertical-cavity surface-emitting laser comprising an upper surface, a bottom surface and a semiconductor multi-layered structure including at least a light-emitting layer, the vertical-cavity surface-emitting laser being supported on the first substrate;
   an electrode structure provided at a different position in the vicinity of the vertical-cavity surface-emitting laser, the electrode structure being electrically connected with the bottom surface of the adjacent vertical-cavity surface-emitting laser for realizing carrier injection between vertical-cavity surface-emitting laser and the electrode structure adjacent thereto, and the electrode structure being supported on the first substrate; and
   a second substrate comprising a first bump and a second bump,
   wherein an upper surface of the electrode structure and the upper surface of the vertical-cavity surface-emitting laser jut out from the first substrate, and the second substrate is positioned with respect to the first substrate so that the first bump and the second bump come into contact with the upper surface of the electrode structure and the upper surface of the vertical-cavity surface-emitting laser, respectively, and
   each of the first bump and the second bump is made of a material which respectively accomplishes electrical bonding between the first bump and the electrode structure and electrical bonding between the second bump and the vertical-cavity surface-emitting laser without involving melting of the first bump and the second bump.

2. An optical module comprising:
   a first substrate;
   a vertical-cavity surface-emitting laser comprising an upper surface, a bottom surface and a semiconductor multi-layered structure including at least a light-emitting layer, the vertical-cavity surface-emitting laser being supported on the first substrate;
   an electrode structure provided at a different position in the vicinity of the vertical-cavity surface-emitting laser, the electrode structure being electrically connected with the bottom surface of the adjacent vertical-cavity surface-emitting laser for realizing carrier injection between vertical-cavity surface-emitting laser and the electrode structure adjacent thereto, and the electrode structure being supported on the first substrate;
   a first supporting structure comprising a conductive upper surface, the first supporting structure being supported on the first substrate;
   a first line for electrically connecting the upper surface of the vertical-cavity surface-emitting laser and the first supporting structure; and
   a second substrate comprising a first bump and a second bump,
   wherein an upper surface of the electrode structure and the upper surface of the first supporting structure jut out from the first substrate, and the second substrate is positioned with respect to the first substrate so that the first bump and the second bump come into contact with the upper surface of the electrode structure and the upper surface of the first supporting structure, respectively, and
   wherein the vertical-cavity surface-emitting laser, the electrode structure and the first supporting structure are positioned at different positions from each other on the first substrate, respectively.

3. An optical module according to claim 1, further comprising a transistor supported on the first substrate and a third bump provided on the second substrate, wherein the third bump is partially in contact with the transistor.

4. An optical module according to claim 2, further comprising: a transistor supported on the first substrate; a second supporting structure comprising a conductive upper surface, the second supporting structure being formed on the first substrate; a second line for electrically connecting the transistor and the second supporting structure; and a third bump provided on the second substrate, wherein the third bump is in contact with the upper surface of the second supporting structure.

5. An optical module comprising:
   a first substrate;
   a vertical-cavity surface-emitting laser comprising an upper surface, a bottom surface which is in contact with the first substrate, and a semiconductor multi-layered structure including at least a light-emitting layer, the vertical-cavity surface-emitting laser being supported on the first substrate;
   a bipolar transistor formed on the upper surface of the vertical-cavity surface-emitting laser;
   an electrode structure provided at a different position in the vicinity of the vertical-cavity surface-emitting laser, the electrode structure being electrically connected with the bottom surface of the adjacent vertical-cavity surface-emitting laser for realizing carrier injection between vertical-cavity surface-emitting laser and the electrode structure adjacent thereto, and the electrode structure being supported on the first substrate; and
   a second substrate comprising a first bump and a second bump,
   wherein an upper surface of the electrode structure juts out from the first substrate, and the second substrate is positioned with respect to the first substrate so that the first bump and the second bump come into contact with the upper surface of the electrode structure and an upper surface of the bipolar transistor, respectively, and
   each of the first bump and the second bump is made of a material which respectively accomplishes electrical bonding between the first bump and the electrode structure and electrical bonding between the second bump and the vertical-cavity surface-emitting laser without involving melting of the first bump and the second bump.

6. An optical module comprising:
   a first substrate;
   a vertical-cavity surface-emitting laser comprising an upper surface, a bottom surface and a semiconductor multi-layered structure including at least a light-emitting layer, the vertical-cavity surface-emitting laser being supported on the first substrate;

a bipolar transistor formed on the upper surface of the vertical-cavity surface-emitting laser;

an electrode structure provided at a different position in the vicinity of the vertical-cavity surface-emitting laser, the electrode structure being electrically connected with the bottom surface of the adjacent vertical-cavity surface-emitting laser for realizing carrier injection between vertical-cavity surface-emitting laser and the electrode structure adjacent thereto, and the electrode structure being supported on the first substrate; and a first supporting structure comprising a conductive upper surface, the first supporting structure being supported on the first substrate;

a first line for electrically connecting the bipolar transistor and the upper surface of the first supporting structure; and a second substrate comprising a first bump and a second bump, wherein an upper surface of the electrode structure and the upper surface of the first supporting structure jut out from the first substrate, and the second substrate is positioned with respect to the first substrate so that the first bump and the second bump come into contact with the upper surface of the electrode structure and the upper surface of the first supporting structure, respectively, and wherein the vertical-cavity surface-emitting laser, the electrode structure and the first supporting structure are positioned at different positions from each other on the first substrate, respectively.

7. An optical module according to claim 2, wherein the first supporting structure is formed close to the vertical-cavity surface-emitting laser.

8. An optical module according to claim 2, wherein the first supporting structure comprises: the same semiconductor layers as the semiconductor layers of the semiconductor multi-layered structure; an insulating layer provided on the semiconductor layers; and an electrode structure provided on the insulating layer.

9. An optical module according to claim 2, wherein the first supporting structure at least comprises: the same semiconductor layers as the semiconductor layers of the semiconductor multi-layered structure; and a metallic film provided on the semiconductor layers.

10. An optical module according to claim 2, wherein a distance between the first substrate and the upper surface of the first supporting structure is longer than a distance between the first substrate and the upper surface of the vertical-cavity surface-emitting laser.

11. An optical module according to claim 3, wherein the bipolar transistor is a field-effect transistor.

12. An optical module according to claim 3, wherein the bipolar transistor is a heterojunction bipolar transistor.

13. An optical module according to claim 1, wherein a gap between the first substrate and the second substrate is filled with an adhesive.

14. An optical module according to claim 13, wherein the adhesive is made of a thermosetting resin.

15. An optical module according to claim 13, wherein the adhesive is made of an ultraviolet curable resin.

16. An optical module according to claim 2, wherein a gap between the first substrate and the second substrate is filled with an adhesive.

17. An optical module according to claim 16, wherein the adhesive is made of a thermosetting resin.

18. An optical module according to claim 16, wherein the adhesive is made of an ultraviolet curable resin.

19. An optical module according to claim 1, comprising a plurality of electrode structures and a plurality of vertical-cavity surface-emitting lasers, wherein the plurality of electrode structures are disposed at respective vertexes of a polygon and the plurality of vertical-cavity surface-emitting lasers are disposed inside the polygon on the first substrate.

20. An optical module according to claim 2, comprising a plurality of electrode structures and a plurality of vertical-cavity surface-emitting lasers, wherein the plurality of electrode structures are disposed at respective vertexes of a polygon and the plurality of vertical-cavity surface-emitting lasers are disposed inside the polygon on the first substrate.

21. An optical module according to claim 2, wherein the first bump and the second bump are made of a metal having a melting point of 350° C. or lower.

22. An optical module according to claim 21, wherein the first bump and the second bump are made of bismuth.

23. An optical module according to claim 2, wherein the upper surface of the vertical-cavity surface-emitting laser and the upper surface of the electrode structure are made of a metal having a melting point of 350° C. or lower.

24. An optical module according to claim 23, wherein the upper surface of the vertical-cavity surface-emitting laser and the upper surface of the electrode structure are made of bismuth.

25. An optical module according to claim 2, wherein the vertical-cavity surface-emitting laser further comprises a first distributed Bragg reflector and a second distributed Bragg reflector which are formed by a semiconductor multi-layered structure and disposed so as to interpose the light-emitting layer.

26. An optical module according to claim 2, wherein a guiding groove to receive an optical fiber is provided in a reverse side of the first substrate in a portion corresponding to the position at which the vertical-cavity surface emitting laser is provided.

27. An optical module according to claim 2, wherein each of the first bump and the second bump is made of a material which respectively accomplishes electrical bonding between the first bump and the electrode structure and electrical bonding between the second bump and the vertical-cavity surface-emitting laser without involving melting of the first bump and the second bump.

28. An optical module according to claim 6, wherein each of the first bump and the second bump is made of a material which respectively accomplishes electrical bonding between the first bump and the electrode structure and electrical bonding between the second bump and the vertical-cavity surface-emitting laser without involving melting of the first bump and the second bump.

29. An optical module according to claim 1, wherein the electrode structure has a broken p-n junction therein so as to have a low resistance between the upper surface and a bottom surface thereof.

30. An optical module according to claim 2, wherein the electrode structure has a broken p-n junction therein so as to have a low resistance between the upper surface and a bottom surface thereof.

31. An optical module according to claim 5, wherein the electrode structure has a broken p-n junction therein so as to have a low resistance between the upper surface and a bottom surface thereof.

32. An optical module according to claim 6, wherein the electrode structure has a broken p-n junction therein so as to have a low resistance between the upper surface and a bottom surface thereof.

33. An optical module comprising:

a first substrate;

a vertical-cavity surface-emitting laser comprising an upper surface, a bottom surface and a semiconductor multi-layered structure including at least a light-emitting layer, the vertical-cavity surface-emitting laser being supported on the first substrate;

an electrode structure provided at a different position in the vicinity of the vertical-cavity surface-emitting laser, the electrode structure being electrically connected with the bottom surface of the adjacent vertical-cavity surface-emitting laser for realizing carrier injection between vertical-cavity surface-emitting laser and the electrode structure adjacent thereto, and the electrode structure being supported on the first substrate; and a second substrate comprising a first bump and a second bump, wherein an upper surface of the electrode structure and the upper surface of the vertical-cavity surface-emitting laser jut out from the first substrate, and the second substrate is positioned with respect to the first substrate so that the first bump and the second bump come into contact with the upper surface of the electrode structure and the upper surface of the vertical-cavity surface-emitting laser, respectively, and wherein each of the first bump and the second bump is made of a constituent material which accomplishes bonding of the first substrate with the second substrate through formation of an alloy of the constituent material.

34. An optical module according to claim 33, further comprising a transistor supported on the first substrate and a third bump provided on the second substrate, wherein the third bump is partially in contact with the transistor.

35. An optical module according to claim 34, wherein the bipolar transistor is a field-effect transistor.

36. An optical module according to claim 34, wherein the bipolar transistor is a heterojunction bipolar transistor.

37. An optical module according claim 33, wherein a gap between the first substrate and the second substrate is filled with an adhesive.

38. An optical module according to claim 37, wherein the adhesive is made of a thermosetting resin.

39. An optical module according to claim 37, wherein the adhesive is made of an ultraviolet curable resin.

40. An optical module according to claim 33, comprising a plurality of electrode structures and a plurality of vertical-cavity surface-emitting lasers, wherein the plurality of electrode structures are disposed at respective vertexes of a polygon and the plurality of vertical-cavity surface-emitting lasers are disposed inside the polygon on the first substrate.

41. An optical module according to claim 33, wherein the first bump and the second bump are made of a metal having a melting point of 350° C. or lower.

42. An optical module according to claim 41, wherein the first bump and the second bump are made of bismuth.

43. An optical module according to claim 33, wherein the upper surface of the vertical-cavity surface-emitting laser and the upper surface of the electrode structure are made of a metal having a melting point of 350° C. or lower.

44. An optical module according to claim 43, wherein the upper surface of the vertical-cavity surface-emitting laser and the upper surface of the electrode structure are made of bismuth.

45. An optical module according to claim 33, wherein the vertical-cavity surface-emitting laser further comprises a first distributed Bragg reflector and a second distributed Bragg reflector which are formed by a semiconductor multi-layered structure and disposed so as to interpose the light-emitting layer.

46. An optical module according to claim 33, wherein a guiding groove to receive an optical fiber is provided in a reverse side of the first substrate in a portion corresponding to the position at which the vertical-cavity surface emitting laser is provided.

47. An optical module according to claim 1, wherein a voltage is applied across the vertical-cavity surface-emitting laser and the electrode structure adjacent thereto for driving the vertical-cavity surface-emitting laser.

48. An optical module according to claim 2, wherein a voltage is applied across the vertical-cavity surface-emitting laser and the electrode structure adjacent thereto for driving the vertical-cavity surface-emitting laser.

49. An optical module according to claim 5, wherein a voltage is applied across the vertical-cavity surface-emitting laser and the electrode structure adjacent thereto for driving the vertical-cavity surface-emitting laser.

50. An optical module according to claim 6, wherein a voltage is applied across the vertical-cavity surface-emitting laser and the electrode structure adjacent thereto for driving the vertical-cavity surface-emitting laser.

51. An optical module according to claim 33, wherein a voltage is applied across the vertical-cavity surface-emitting laser and the electrode structure adjacent thereto for driving the vertical-cavity surface-emitting laser.

* * * * *